United States Patent
Iwasaka et al.

(10) Patent No.: US 9,252,161 B2
(45) Date of Patent: Feb. 2, 2016

(54) THIN FILM TRANSISTOR ARRAY SUBSTRATE AND MANUFACTURING METHOD THEREOF, AND LIQUID CRYSTAL DISPLAY DEVICE AND MANUFACTURING METHOD THEREOF

(71) Applicant: Mitsubishi Electric Corporation, Tokyo (JP)

(72) Inventors: Toshihiko Iwasaka, Kumamoto (JP); Makoto Hirakawa, Kumamoto (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/336,410

(22) Filed: Jul. 21, 2014

(65) Prior Publication Data
US 2015/0028340 A1   Jan. 29, 2015

(30) Foreign Application Priority Data
Jul. 26, 2013 (JP) .................. 2013-155544

(51) Int. Cl.
*H01L 29/06* (2006.01)
*H01L 27/12* (2006.01)

(52) U.S. Cl.
CPC .......... *H01L 27/124* (2013.01); *H01L 27/1288* (2013.01)

(58) Field of Classification Search
CPC .................. H01L 27/1244; H01L 27/124
USPC ...................... 257/72, 773, 775, 48
See application file for complete search history.

(56) References Cited

U.S. PATENT DOCUMENTS

| | | | |
|---|---|---|---|
| 5,861,326 A * | 1/1999 | Yamazaki et al. | 438/149 |
| 6,750,087 B2 | 6/2004 | Morita et al. | |
| 8,451,395 B2 | 5/2013 | Nagano et al. | |
| 2003/0186478 A1 * | 10/2003 | Morita et al. | 438/30 |
| 2006/0131581 A1 * | 6/2006 | Kim et al. | 257/59 |
| 2006/0175706 A1 * | 8/2006 | Lee et al. | 257/763 |
| 2007/0034879 A1 * | 2/2007 | Park et al. | 257/72 |
| 2007/0093005 A1 * | 4/2007 | Kim et al. | 438/149 |
| 2007/0152220 A1 * | 7/2007 | Kwack | 257/59 |
| 2008/0001177 A1 * | 1/2008 | Kim et al. | 257/213 |
| 2008/0002125 A1 * | 1/2008 | Kim | 349/140 |
| 2008/0203390 A1 * | 8/2008 | Kim et al. | 257/59 |
| 2008/0210941 A1 * | 9/2008 | Watanabe et al. | 257/59 |
| 2009/0206342 A1 * | 8/2009 | Hosoya et al. | 257/72 |
| 2009/0207362 A1 * | 8/2009 | Nagano et al. | 349/139 |
| 2009/0295696 A1 * | 12/2009 | Uehara | 345/92 |
| 2009/0295701 A1 * | 12/2009 | Matsumoto et al. | 345/92 |
| 2010/0051934 A1 * | 3/2010 | Choung et al. | 257/43 |
| 2010/0187532 A1 * | 7/2010 | Nagano et al. | 257/59 |
| 2013/0134489 A1 * | 5/2013 | Kao et al. | 257/288 |
| 2015/0162351 A1 * | 6/2015 | Hiwatashi et al. | 257/43 |
| 2015/0162358 A1 * | 6/2015 | Inoue et al. | 257/43 |

FOREIGN PATENT DOCUMENTS

| | | |
|---|---|---|
| JP | 2003-297850 A | 10/2003 |
| JP | 2010-191410 A | 9/2010 |

* cited by examiner

*Primary Examiner* — Fernando Toledo
*Assistant Examiner* — Victoria K Hall
(74) *Attorney, Agent, or Firm* — Studebaker & Brackett PC

(57) ABSTRACT

Source wires having a semiconductor film thereunder are formed wide within a range that does not overlap pixel electrodes formed later. Thereafter, a resist pattern for use in patterning the pixel electrodes is formed so as to overlap edge portions of the source wires, and etching using the resist pattern as a mask is performed, whereby the pixel electrodes are formed, and in addition, the edge portions of the source wires are removed, whereby a structure in which the semiconductor film has a portion projecting beyond the source wires on both sides is formed.

8 Claims, 23 Drawing Sheets

F I G . 1
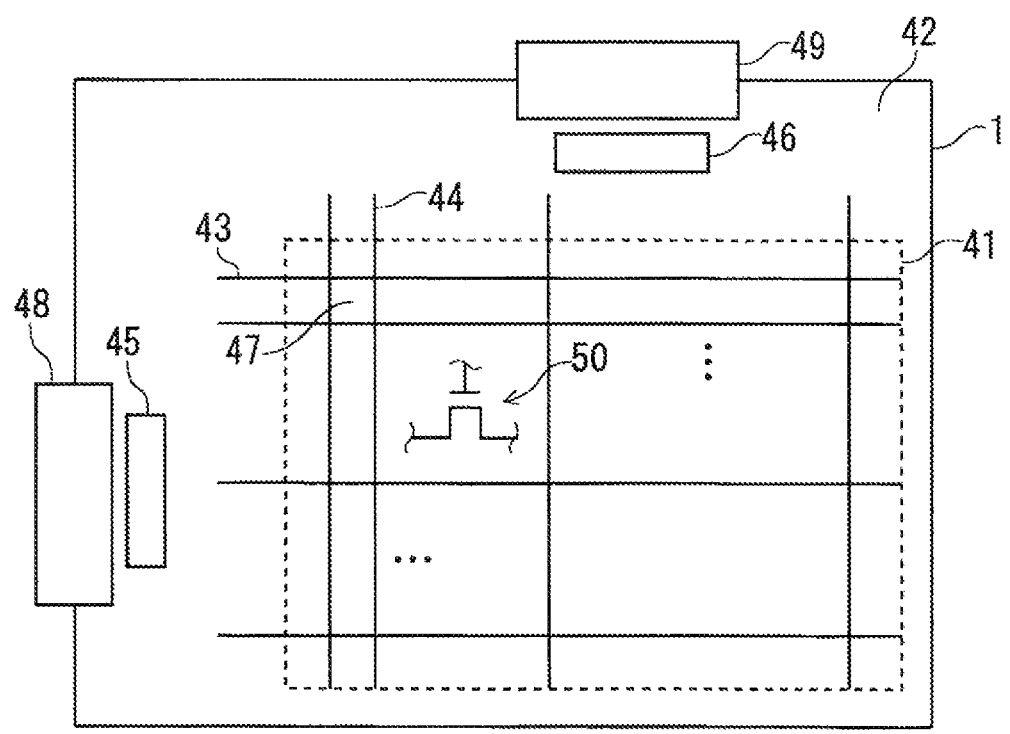

TFT PORTION

SOURCE WIRE/PIXEL ELECTRODE PORTION

COMMON CONTACT PORTION

F I G. 6
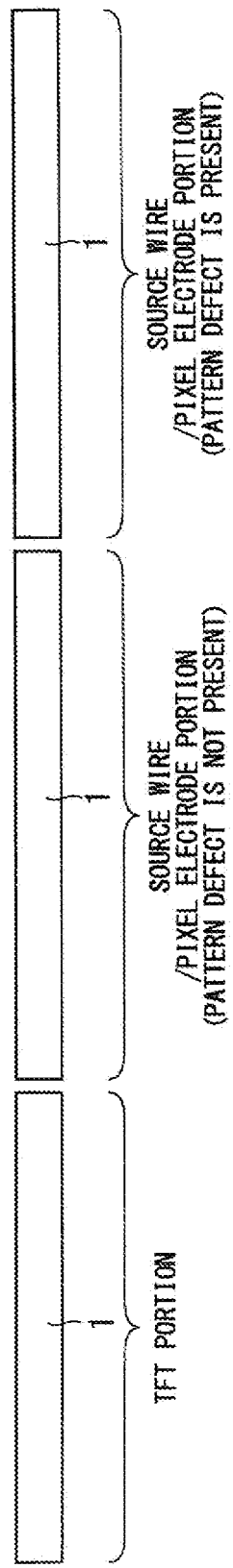

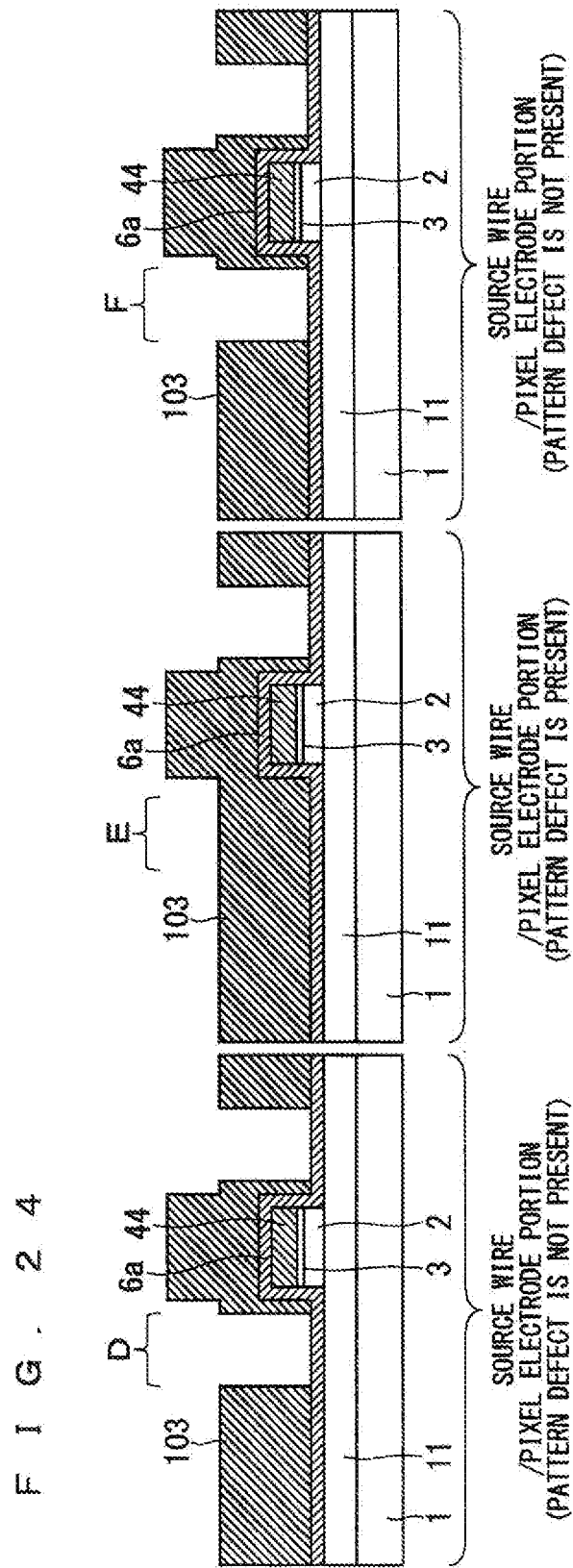

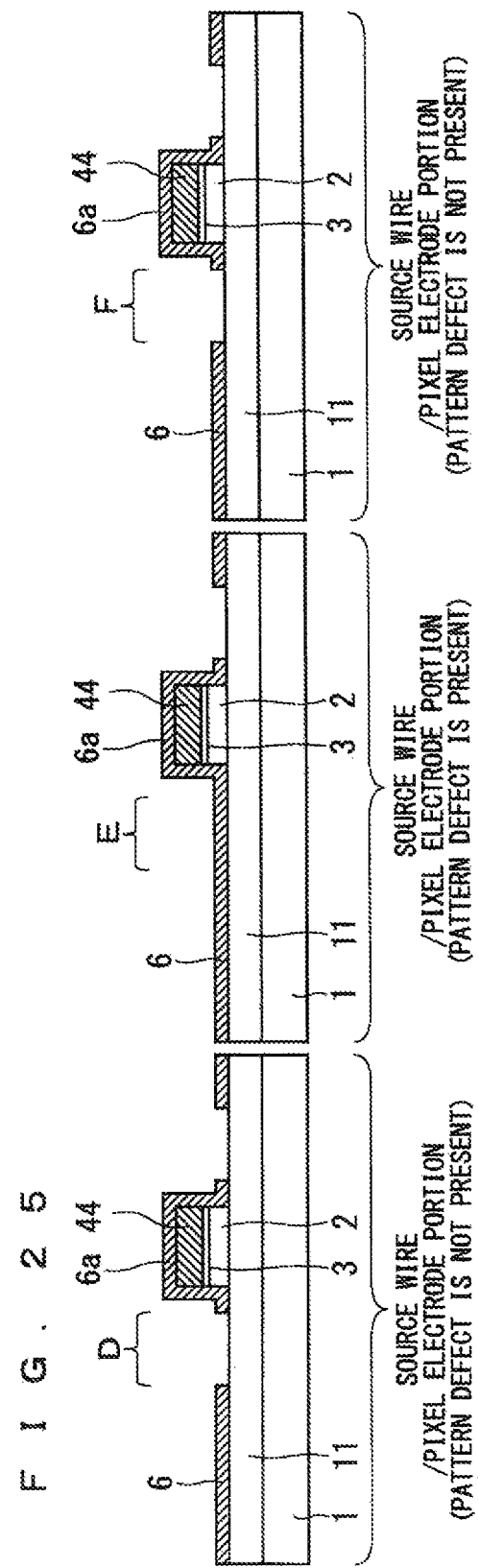

THIN FILM TRANSISTOR ARRAY SUBSTRATE AND MANUFACTURING METHOD THEREOF, AND LIQUID CRYSTAL DISPLAY DEVICE AND MANUFACTURING METHOD THEREOF

BACKGROUND OF THE INVENTION

1. Field of the Invention

The present invention relates to a thin film transistor array substrate, for example, for use in a liquid crystal display device, and particularly, to a thin film transistor array substrate for use in a liquid crystal display device in a fringe field switching mode, and to a manufacturing method of the thin film transistor array substrate.

2. Description of the Background Art

A liquid crystal display device in a fringe field switching (FFS) mode is a display device that performs display by applying a fringe field to a liquid crystal sandwiched between two substrates opposite to each other. A pixel electrode and a counter electrode (common electrode) are formed of transparent conductive films, and accordingly, an aperture ratio and a transmittance in the liquid crystal display device in the FFS mode can be increased more than those of a liquid crystal display device in an in-plane switching (IPS) mode.

In such a conventional liquid crystal display device in the FFS mode, in order to manufacture a thin film transistor (TFT) array substrate, there are required at least six photolithography steps of transferring respective patterns of: (1) a counter electrode; (2) a gate electrode; (3) a semiconductor film; (4) a source/drain electrode; (5) a contact hole; and (6) a pixel electrode, and there is a problem that manufacturing cost is increased in comparison with a liquid crystal display device in a TN (Twisted Nematic) mode capable of manufacturing the TFT array substrate by five photolithography steps. Meanwhile, for example, Japanese Patent Application Laid-Open No. 2010-191410 proposes a technology for forming the liquid crystal display device in the FFS mode by five photolithography steps.

In a manufacturing method of the liquid crystal display device in Japanese Patent Application Laid-Open No. 2010-191410, in order to set the number of photolithography steps for the TFT array substrate in the FFS mode at the same number (five) as the number of photolithography steps for the TFT array substrate in the general TN mode, a configuration is adopted, in which the transparent conductive film is arranged on a metal film pattern, which becomes a source wire, without an insulating film being interposed therebetween.

The TFT array substrate formed by the manufacturing method in Japanese Patent Application Laid-Open No. 2010-191410 forms a structure in which the transparent conductive film, which becomes a pixel electrode, remains not only on a forming region of the pixel electrode but also on a source wire adjacent to the forming region. Therefore, there is a problem that a cross talk point defect, which is caused by the fact that the pixel electrode and the source wire connect to each other by a pattern defect of the transparent conductive film, is prone to occur.

Repair of the cross talk point defect is performed by cutting or removing (laser repair cut) the pattern defect of the transparent conductive film, which remains so as to connect the source wire and the pixel electrode to each other, by using a laser repair device after patterning of the pixel electrode. Alternatively, in some case, the repair is performed by cutting or removing the pattern defect of the resist pattern, which is formed so as to lie astride the source wire and the forming region of the pixel electrode, by using the laser repair device after formation of a resist pattern that becomes a mask for patterning the pixel electrode. The pattern defect of the resist pattern is cut or removed, whereby an occurrence of the pattern defect of the transparent conductive film can be avoided. Note that, in some case, the pattern defect of the resist pattern is formed of a foreign object other than such a resist material.

By the laser repair device, a position of the cross talk point defect (that is, a position of the pattern defect of the transparent electrode or the resist pattern) cannot be specified. Therefore, it is necessary to specify the position of the cross talk point defect by an inspection (pattern defect inspection) performed by using a pattern defect inspection device or an optical inspection device. As a method of the pattern defect inspection, such a method is general, in which light is applied onto pixel patterns arranged periodically, pieces of reflected light thereof are compared with one another at the same spot of three or more pixel patterns, and a spot different in brightness from those of other pixel patterns is detected as the position of the pattern defect.

In the above-described pattern defect inspection, it is easier to detect the pattern defect as a brightness difference of the reflected light appears to a larger extent between a spot of a normal pattern and the spot of the pattern defect. However, in the TFT array substrate in Japanese Patent Application Laid-Open No. 2010-191410, the spot of the normal pattern between the source wire and the pixel electrode forms a structure in which only an insulating film is formed on the substrate, and the spot where the cross talk point defect occurs forms a structure in which the insulating film and the transparent conductive film are formed on the substrate. Therefore, such a large brightness difference is not generated in the reflected light between the spot of the normal pattern and the spot of the cross talk point defect, and it is difficult to detect the pattern defect. If the pattern defect remains without being detected, then the cross talk point defect occurs as a result.

SUMMARY OF THE INVENTION

It is an object of the present invention to make it possible to more surely detect, in the liquid crystal display device in the FFS mode, the cross talk point defect which occurs between the source wire and the pixel electrode portion, while suppressing the number of the photolithography steps at the time of manufacturing the liquid crystal display device.

A thin film transistor array substrate according to the present invention has a thin film transistor formed on the substrate. A gate electrode of the thin film transistor and a gate wire connected to the gate electrode are formed on a substrate. A gate insulating film of the thin film transistor covers the gate electrode and the gate wire. A semiconductor film of the thin film transistor is formed on the gate insulating film. A source electrode and a drain electrode of the thin film transistor are formed on the semiconductor film above the gate electrode. A source wire connected to the source electrode is formed on the gate insulating film. The thin film transistor array substrate further includes: a pixel electrode formed by being partially and directly stacked on the drain electrode; an interlayer insulating film that covers the source electrode, the drain electrode, the source wire and the pixel electrode; and a counter electrode arranged opposite to the pixel electrode with the interlayer insulating film being interposed therebetween. The semiconductor film is provided individually under the drain electrode, the source electrode and the source wire, and in a region between the source electrode and the drain electrode. The semiconductor film under the source wire has a portion projecting beyond the source wire on both sides, and the width of the portion is 1 μm or more.

It is possible to form the thin film transistor array substrate according to the present invention by using five photolithography steps. Moreover, in the event of patterning the pixel electrode in the manufacturing process of the thin film transistor array substrate, the edge portion of the source wire is exposed to the aperture of the resist pattern. Therefore, when the pattern defect inspection for the resist pattern is performed, the brightness at the spots of the aperture of the resist pattern is increased to a larger extent than the brightness of the spot in which the aperture is not formed owing to the pattern defect, and it becomes easy to detect the pattern defect spot.

Moreover, in the manufacturing process of the thin film transistor array substrate, the edge portion of the source wire exposed to the aperture of the resist pattern is removed, and the semiconductor film thereunder has a portion projecting beyond the source wire on both sides. As opposed to this, at the spot in which the aperture is not formed owing to the pattern defect but the pattern defect of the pixel electrode occurs, the source wire is left. Therefore, when the pattern defect inspection is performed after the removal of the resist pattern, the brightness at the spot in which the pattern defect of the pixel electrode occurs is increased to a larger extent than the brightness of the spots with the normal pattern, and it becomes easy to detect the pattern defect spot.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a front view showing a configuration of a TFT array substrate for use in a liquid crystal display device according to a preferred embodiment of the present invention;

FIGS. 6 to 17 are manufacturing step views of the TFT array substrate according to the preferred embodiment of the present invention;

FIGS. 23 to 25 are views for explaining a pattern defect inspection for the conventional TFT array substrate.

DESCRIPTION OF THE PREFERRED EMBODIMENTS

Figure 2:
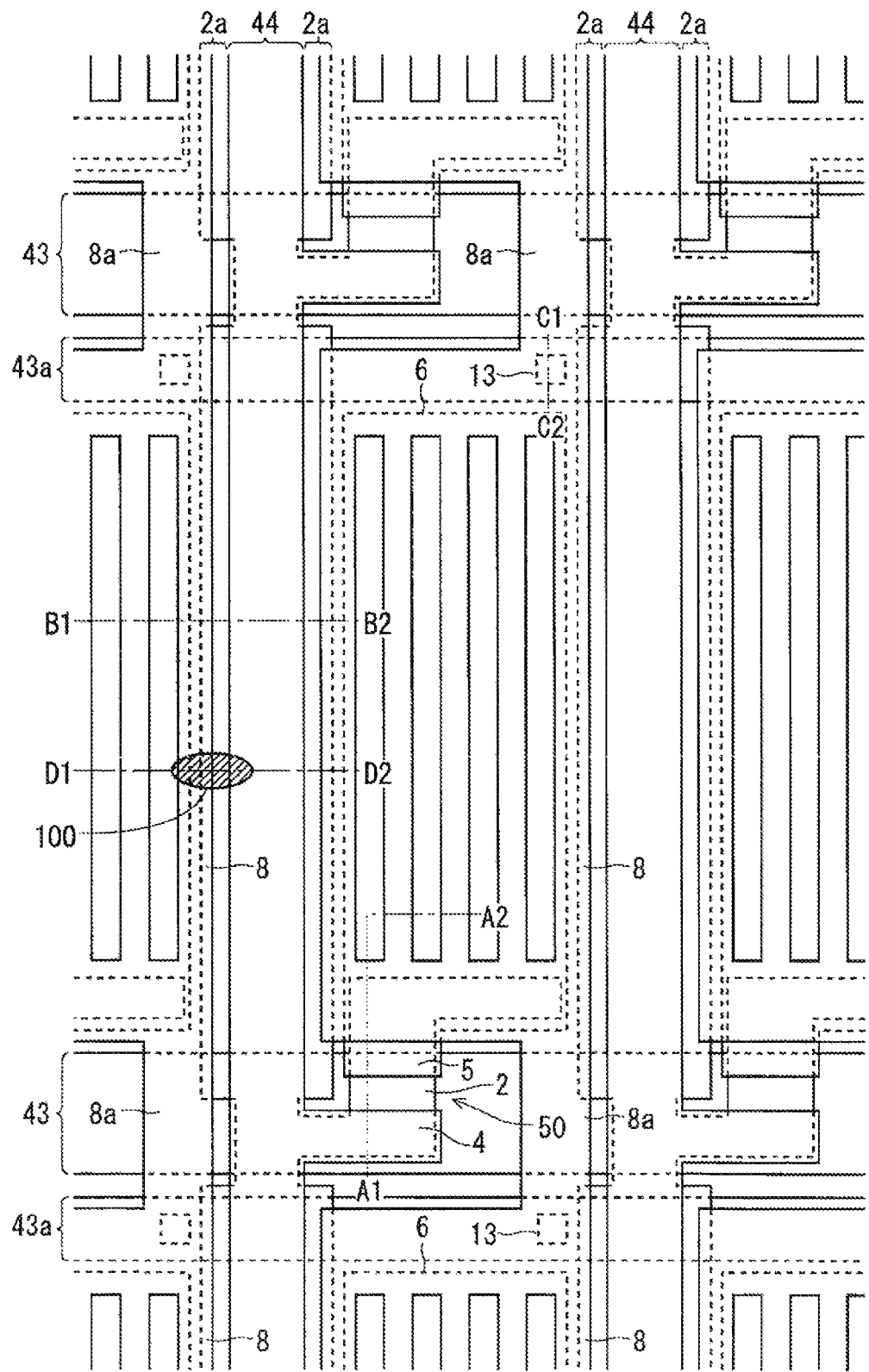
FIG. 2 is a plan view showing a pixel configuration of the TFT array substrate according to the preferred embodiment of the present invention.

The following description describes a preferred embodiment of the present invention, and the present invention is not limited to the following preferred embodiment. For the purpose of clarifying the description, the following description and the drawings are appropriately omitted and simplified. Moreover, for the purpose of clarifying the description, a duplicate description is omitted according to needs. Note that those to which the same reference numerals are assigned in the respective drawings indicate similar components, and a description thereof is appropriately omitted.

First, a description is made of a liquid crystal display device. This liquid crystal display device is a liquid crystal display device in an FFS mode, in which both of a pixel electrode and a counter electrode (common electrode) are formed on a TFT array substrate.

FIG. 1 is a front view showing a configuration of a TFT array substrate for use in the liquid crystal display device. This TFT array substrate is formed by using a substrate 1 such as glass. The substrate 1 is classified into a display region 41 and a frame region 42 that surrounds the same.

A plurality of gate wires (scan signal lines) 43 and a plurality of source wires (display signal lines) 44 are formed on the display region 41. The plurality of gate wires 43 are provided in parallel to one another, the plurality of source wires 44 are also provided in parallel to one another, and the plurality of gate wires 43 and the plurality of source wires 44 are provided so as to intersect each other. A region, which is surrounded by a set of the gate wires 43 adjacent to each other and by a set of the source wires 44 adjacent to each other, becomes a pixel 47. Hence, on the display region 41, pixels 47 are arrayed in a matrix.

On the frame region 42 of the substrate 1, a scan signal drive circuit 45 and a display signal drive circuit 46 are provided. The gate wires 43 are extended from the display region 41 to the frame region 42, and are connected to the scan signal drive circuit 45 at an end portion of the substrate 1. In a similar way, the source wires 44 are extended from the display region 41 to the frame region 42, and are connected to the display signal drive circuit 46 at an end portion of the substrate 1. Moreover, an external wire 48 is connected to the substrate 1 in the vicinity of the scan signal drive circuit 45, and an external wire 49 is connected to the substrate 1 in the vicinity of the display signal drive circuit 46. For example, the external wires 48 and 49 are wiring substrates such as FPC (Flexible Printed Circuits).

To the scan signal drive circuit 45 and the display signal drive circuit 46, a variety of signals from an outside are supplied through the external wires 48 and 49. The scan signal drive circuit 45 supplies gate signals (scan signals) to the respective gate wires 43 based on a control signal from the outside. In this way, the gate wires 43 are sequentially selected. The display signal drive circuit 46 supplies display signals to the respective source wires 44 based on a control signal and display data from the outside. In this way, display voltages corresponding to the display data can be supplied to the respective pixels 47.

In each of the pixels 47, at least one TFT 50 that is a switching element is formed. The TFT 50 is arranged in the vicinity of an intersection point of the gate wire 43 and the source wire 44, and includes: a gate electrode connected to the gate wire 43; a source electrode connected to the source wire 44; and a drain electrode connected to a pixel electrode (not shown).

The TFT 50 turns on in response to the gate signal supplied from the gate wire 43, and applies the display voltage (display data), which is supplied to the source wire 44 at this time, to the pixel electrode. The pixel electrode is arranged opposite to a counter electrode, which has a slit, with an insulating film being interposed therebetween, and a fringe field corresponding to the display voltage, is generated between the pixel electrode and the counter electrode. Note that, though not shown, an orientation film is formed on a front surface (counter surface to the liquid crystal) of the substrate 1. A detailed configuration of the pixel 47 will be described later.

On a front surface side (visual recognition side) of the TFT array substrate, a counter substrate is arranged opposite to the TFT array substrate. The counter substrate is a so-called "color filter substrate" in which color filters, a black matrix (BM), the orientation film and the like are formed. A liquid crystal layer is sandwiched between the TFT array substrate and the counter substrate. That is to say, the liquid crystal is introduced into between the substrate 1 and the counter substrate. Moreover, on outside surfaces of the substrate 1 and the counter surface, polarization plates, phase difference plates and the like are provided. Furthermore, a backlight unit and the like are provided on a back surface side (opposite to a visual recognition side) of a liquid crystal display panel.

The liquid crystal between the TFT array substrate and the counter substrate is driven by the fringe field generated between the pixel electrode and the counter electrode. That is to say, an orientation direction of the liquid crystal is changed by the fringe field, and a polarization state of light that is emitted from the backlight and passes through the liquid crystal layer is changed. More specifically, the light from the backlight unit becomes a linear polarization by the polarization plate on the array substrate side (back surface side), and when this linear polarization passes through the liquid crystal layer, a polarization state thereof is changed.

A quantity of light that passes through the polarization plate on the counter substrate side (visual recognition side) is changed depending on the polarization state of the light that passes through the liquid crystal layer. A changed state of the light is determined depending on the orientation direction of the liquid crystal, and the orientation direction of the liquid crystal is changed in response to the display voltage that is applied to the pixel electrode and generates the fringe field. Hence, the display voltage is controlled, whereby the quantity of light that passes through the polarization plate on the visual recognition side can be changed. Hence, the display voltage is changed for each of the pixels, whereby a desired image can be displayed.

Figure 3:
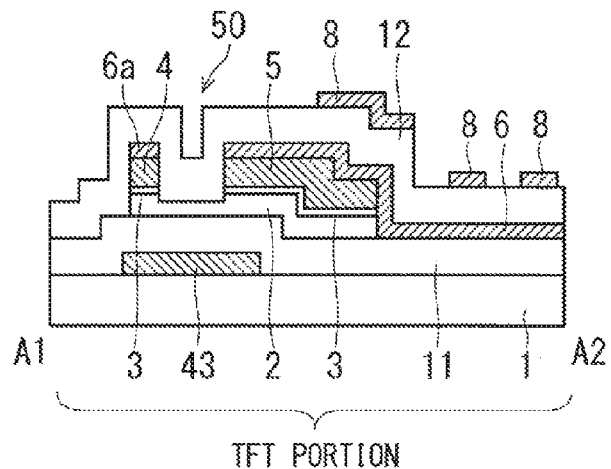
FIG. 3 is a cross-sectional view of a TFT portion in the TFT array substrate according to the preferred embodiment of the present invention.
Figure 4:
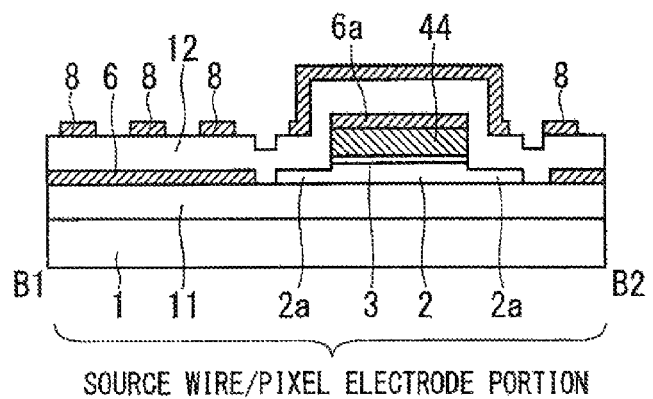
FIG. 4 is a cross-sectional view of a source wire/pixel electrode portion in the TFT array substrate according to the preferred embodiment of the present invention.
Figure 5:
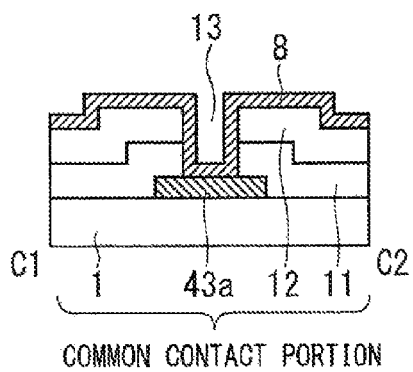
FIG. 5 is a cross-sectional view of a contact portion of the TFT array substrate according to the preferred embodiment of the present invention.

Subsequently, a description is made of a pixel configuration of the liquid crystal display device according to this preferred embodiment based on FIG. 2 to FIG. 5. FIG. 2 is a plan view showing a pixel configuration of the TFT array substrate. FIG. 3 is a cross-sectional view of a forming region of the TFT (hereinafter, a "TFT portion") in the TFT array substrate, and FIG. 3 corresponds to a cross section along a line A1-A2 of FIG. 2. FIG. 4 is a cross-sectional view of a part of the source wire, the pixel electrode and the counter electrode (hereinafter, a "source wire/pixel electrode portion") in the TFT array substrate, and FIG. 4 corresponds to a cross section along a line B1-B2 of FIG. 2. FIG. 5 is a cross-sectional view of a contact-hole forming region for a common wire and the counter electrode (hereinafter, a "common contact portion") in the TFT array substrate, and FIG. 5 corresponds to a cross section along a line C1-C2 of FIG. 2.

On the substrate 1 made of an insulating material, for example, such as a glass substrate, the plurality of gate wires 43 connected to the gate electrodes of the TFTs 50 are formed. In this preferred embodiment, a part of the gate wires 43 functions as the gate electrodes of the TFTs 50. The plurality of gate wires 43 are provided individually linearly in parallel to one another. Moreover, on the substrate 1, a plurality of common wires 43a formed by using the same wiring layers as the gate wires 43 are formed in parallel. The common wires 43a are provided between the gate wires 43 so as to be substantially in parallel to the gate wires 43.

A first metal film that composes these gate wires 43 (gate electrodes) and common wires 43a is formed, for example, of Cr, Al, Ta, Ti, Mo, W, Ni, Cu, Au, Ag or the like, an alloy film containing these as main components, or a stacked film of these.

On the gate wires 43 and the common wires 43a, a gate insulating film 11 that is a first insulating film is formed. The gate insulating film 11 is formed of an insulating film of silicon nitride, silicon oxide or the like.

On the gate insulating film 11, a semiconductor film 2 is formed. As shown in FIG. 4, the semiconductor film 2 is also provided under the source wire 44, and is formed linearly so as to intersect the gate wires 43 in matching with the forming regions of the source wires 44 (the semiconductor film 2 under the source wires 44 is perpendicular to the gate wires 43 in patterning). The semiconductor film 2 is formed, for example, of amorphous silicon, polycrystalline silicon or the like.

This linear semiconductor film 2 also functions as redundant wires of the source wires 44. That is to say, even in a case where the source wires 44 are disconnected, the semiconductor film 2 is provided along the source wires 44, whereby it becomes possible to prevent a breakdown of such an electrical signal.

In this preferred embodiment, as in FIG. 4, the semiconductor film 2 under each of the source wires 44 is formed wider in width than the source wire 44, and has a portion projecting beyond the source wire 44 on both sides. Hereinafter, portions of the semiconductor film 2, which project beyond the source wire 44, are referred to as "projecting portions 2a".

Moreover, a part of the linear semiconductor film 2 is branched at an intersection portion with each of the gate wires 43, is extended along the gate wire 43, and is further extended into the pixel 47. The TFT 50 is formed by using such a portion of the semiconductor film 2, which is branched from the intersection portion with the gate wire 43. That is to say, a portion of the branched semiconductor film 2, which overlaps the gate wire 43 (gate electrode), becomes an active region that composes the TFT 50. The semiconductor film 2 is formed, for example, of amorphous silicon, polycrystalline silicon or the like.

On the semiconductor film 2, an ohmic contact film 3 doped with semiconductor impurities is formed. The ohmic contact film 3 is formed on substantially an entire surface on the semiconductor film 2; however, is removed from the surface on the semiconductor film 2 at a portion that becomes a channel region of the TFT 50 (a region between the source electrode 4 and the drain electrode 5), and at a portion which projects beyond the source wire 44 (projecting portions 2a). The ohmic contact film 3 is formed, for example, of n-type amorphous silicon, n-type polycrystalline silicon or the like, which is doped with impurities such as phosphorous (P) at a high concentration.

In the portion of the semiconductor film 2 which overlaps the gate wire 43, a region in which the ohmic contact film 3 is formed becomes a source/drain region. Referring to FIG. 3, in the semiconductor film 2, a region under the left-side ohmic contact film 3, which overlaps the gate wire 43, becomes a source region, and a region under the right-side ohmic contact film 3, which overlaps the gate wire 43, becomes a drain region. Then, a region sandwiched by the source region and the drain region in the semiconductor film 2 becomes a channel region.

On the ohmic contact film 3, the source wire 44, the source electrode 4 and the drain electrode 5 are formed by using the same wiring layer. In the TFT portion, as in FIG. 3, the source electrode 4 is formed on the ohmic contact film 3 on the source region side of the TFT 50, and the drain electrode 5 is formed on the ohmic contact film 3 on the drain region side of the TFT 50. The TFT 50 with such a configuration is called a "channel etch-type TFT". In the source wire/pixel electrode portion, as in FIG. 4, the source wire 44 is formed on the semiconductor film 2 with the ohmic contact film 3 being interposed therebetween, and is provided so as to be extended linearly in a direction of intersecting the gate wire 43.

The source electrode 4 and drain electrode 5 of the TFT 50 are separated from each other; however, the source electrode 4 connects to the source wire 44. That is to say, the source wire 44 is branched at the intersection portion with the gate wire 43, and is extended along the gate wire 43, and a portion thus extended becomes the source electrode 4. In a similar way to the ohmic contact film 3, a conductive film that composes the source wire 44, the source electrode 4 and the drain electrode 5 is formed on substantially the entire surface on the semiconductor film 2; however, it is removed at the portion that becomes the channel region of the TFT 50 and the projecting portions 2a of the semiconductor film 2 provided under the source wire 44.

As shown in FIG. 4, the projecting portions 2a of the semiconductor film 2 are arranged on both sides of the source wire 44 (regions between the source wire 44 and the pixel electrode portion 6) so as not to connect to the pixel electrode 6. Moreover, the width of the projecting portions 2a is 1 μm or more from side edges of the source wire 44.

In this preferred embodiment, a second conductive film that composes the source wires 44, the source electrodes 4 and the drain electrodes 5 is formed, for example, of Cr, Al, Ta, Ti, Mo, W, Ni, Cu, Au, Ag or the like, an alloy film containing these as main components, or a stacked film of these. In particular, the second conductive film is preferably a metal film with a high reflectivity, such as Al or an alloy containing Al as a main component, Au or an alloy containing Au as a main component, and Ag or an alloy containing Ag as a main component. In this preferred embodiment, if the source wire 44 is formed of the metal film with a high reflectivity, then a brightness difference between a spot (normal pattern spot) of a normal pattern and a spot (pattern defect spot) where the pattern defect occurs is increased in a subsequent pattern defect inspection, whereby a detection rate of the pattern defect can be enhanced.

As understood from the above description, the semiconductor film 2 is provided on substantially an entire region under the source wire 44, the source electrode 4 and the drain electrode 5, on both sides of the source wire 44, and on the channel region between the source electrode 4 and the drain electrode 5, which is located on the gate wire 43. Moreover, the ohmic contact film 3 is provided between the source wire 44 and the semiconductor film 2, between the source electrode 4 and the semiconductor film 2, and between the drain electrode 5 and the semiconductor film 2.

The drain electrode 5 is electrically connected to the pixel electrode 6 formed on substantially the entire surface of a region of the pixel 47 (the region surrounded by the source wires 44 and the gate wires 43). The pixel electrode 6 is formed of a transparent conductive film of ITO (Indium Tin Oxide) or the like.

As shown in FIG. 3, the pixel electrode 6 has a portion directly stacked on the drain electrode 5. That is to say, in that portion, a lower surface of the pixel electrode 6 is brought into direct contact with an upper surface of the drain electrode 5.

Moreover, the pixel electrode 6 covers substantially an entire surface of the drain electrode 5. However, a channel region-side end portion of the pixel electrode 6 is arranged at substantially the same position as that of a channel region-side end portion of the drain electrode 5. Hence, a channel region-side end surface of the drain electrode 5 is not covered with the pixel electrode 6.

As described above, a configuration, in which a part of the pixel electrode 6 is directly stacked on the drain electrode 5 without the insulating film interposed therebetween, is adopted, whereby a contact hole for electrically connecting the pixel electrode 6 and the drain electrode 5 to each other becomes unnecessary, and the photolithography steps can be reduced. Moreover, it becomes unnecessary to ensure an area for arranging the contact hole, and accordingly, there is also an advantage that an aperture ratio of the pixel 47 can be enhanced.

Moreover, as shown in FIG. 3 and FIG. 4, a first transparent conductive film 6a which is the same layer as the pixel electrode 6 is formed by being directly stacked on the source electrode 4 and the source wire 44. End portions of the source electrode 4 and the source wire 44 are not covered with the first transparent conductive film 6a.

As described above, the first transparent conductive film 6a which is the same layer as the pixel electrode 6 is formed on substantially the entire surfaces on the source wire 44, the source electrode 4 and the drain electrode 5, which are formed by using the first metal film. In particular, the first transparent conductive film 6a on the source wire 44 also functions as a redundant wire of the source wire 44. That is to say, even in a case where the source wire 44 is disconnected, the first transparent conductive film 6a is provided along the source wire 44, whereby it becomes possible to prevent the breakdown of the electrical signal.

The surface of the pixel electrode 6 (first transparent conductive film 6a) is covered with an interlayer insulating film 12 that is a second insulating film. The interlayer insulating film 12 is formed of silicon nitride, silicon oxide or the like. On the interlayer insulating film 12, a counter electrode 8 made of a second transparent conductive film of ITO or the like is formed. The interlayer insulating film 12 functions as a protection film of the TFT 50, and in addition, also functions as an interlayer insulating film between the pixel electrode 6 and the counter electrode 8.

The counter electrode 8 is arranged opposite to the pixel electrode 6 with the interlayer insulating film 12 being interposed therebetween, and has slits provided therein, the slits being provided for generating the fringe field with the pixel electrode 6. As shown in FIG. 2, a plurality of the slits of the counter electrode 8 are provided substantially in parallel to the source wire 44.

As shown in FIG. 5, the counter electrode 8 is electrically connected to the common wire 43a, which is supplied with a common potential, with a contact hole 13 being interposed therebetween and penetrating the interlayer insulating film 12 and the gate insulating film 11.

Moreover, the counter electrode 8 is formed integrally with the counter electrode 8 of other pixel 47 adjacent thereto with the gate wire 43 being sandwiched therebetween (a part of the counter electrode 8 is formed so as to cover the gate wire 43, and is connected to the counter electrode 8 of the other pixel 47 adjacent to the counter electrode 8 with the gate wire 43 being sandwiched therebetween). That is to say, the counter electrodes 8 of the pixels adjacent to each other with the gate wire 43 being sandwiched therebetween are coupled to each other by a counter electrode joint portion 8a that is the same layer as those. Here, the counter electrode joint portion 8a is formed on a region, which does not overlap the source wire 44 and the TFT 50, so as to lie astride the gate wire 43. That is to say, the counter electrode 8 is formed so as to partially overlap the gate wire 43.

The counter electrode 8 may be formed integrally with such a counter electrode 8 of the other pixel 47 adjacent thereto with the source wire 44 being sandwiched therebetween. That is to say, a part of the counter electrode 8 may be formed so as to cover the source wire 44, and is connected to the counter electrode 8 of the other pixel 47 adjacent thereto with the source wire 44 being sandwiched therebetween. As a matter of course, a structure may be adopted, in which the counter electrode 8 is connected to both of the counter electrode 8 of the other pixel 47 adjacent to the counter electrode 8 with the gate wire 43 being sandwiched therebetween, and the counter electrode 8 of the other pixel 47 adjacent to the counter electrode 8 with the source wire 44 being sandwiched therebetween.

Subsequently, a description is made of a manufacturing method of the liquid crystal display device according to the preferred embodiment, and in particular, a manufacturing method of the TFT array substrate.

FIG. 6 to FIG. 17 are manufacturing step views of the TFT array substrate in this preferred embodiment. Each of FIG. 6 to FIG. 17 shows a cross section (A1-A2 cross section of FIG. 2) of the TFT portion and a cross section of the source wire/pixel electrode portion in each of the steps. For the purpose of explaining the effects of the present invention, as the cross section of the source wire/pixel electrode portion, two are shown, which are: a portion (B1-B2 cross section of FIG. 2) in which the normal pattern is formed; and a portion (D1-D2 cross section of FIG. 2) including a pattern defect spot 100 that causes the cross talk point defect in a forming step of the pixel electrode 6.

First, the transparent and insulating substrate 1 such as glass is prepared (FIG. 6), and on the entire surface thereof, the first metal film made of Cr, Ag, Ta, Ti, Mo, W, Ni, Cu, Au, Ag, the alloy film containing these as main components, or the stacked film of these is deposited, for example, by a sputtering method, an evaporation method or the like.

Figure 7:
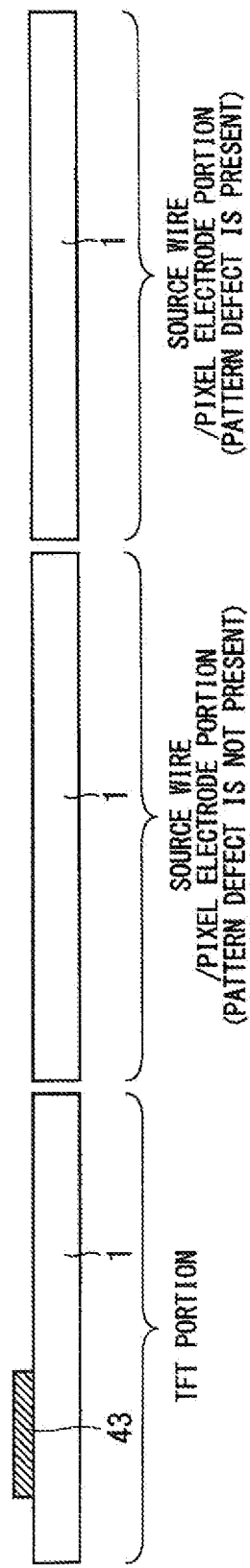
Figure 8:
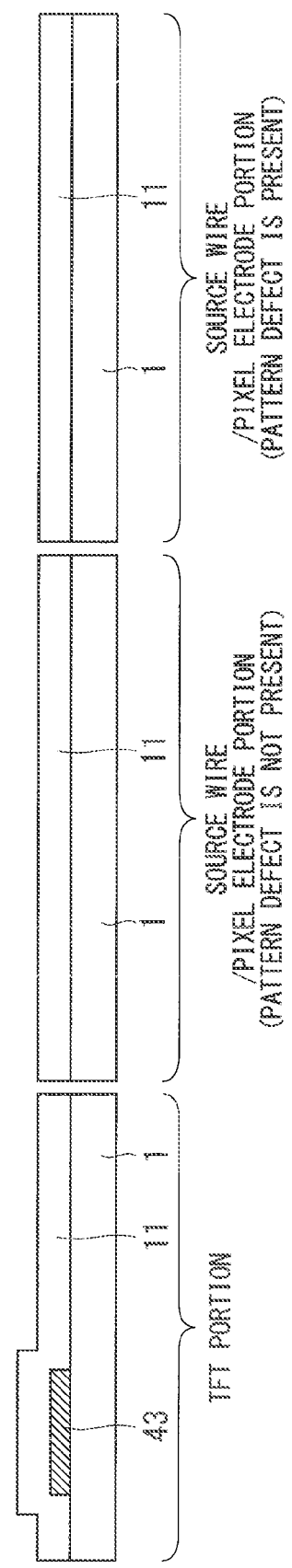

Next, resist is applied onto the first metal film, and the resist is exposed from above a photomask to be photosensitized. The exposed resist is developed and patterned, and a resist pattern is formed. Then, the first metal film is patterned by etching that uses this resist pattern as a mask, and the gate wire 43 (gate electrode) and the common wire 43a are formed, and thereafter, the resist pattern is removed (FIG. 7).

Hereinafter, in such a pattern forming process as described above, a series of the steps for forming the resist pattern is referred to as "photolithography steps", the step of the patterning that uses the resist pattern is referred to as an "etching step", and the step of removing the resist pattern is referred to as a "resist removal step". By the first photolithography steps, the first etching step and the first resist removal step, which are described above, the gate wire 43 (gate electrode) and the common wire 43a (see FIGS. 2, 5, 18 and 23), which are made of the first metal film, are formed on the substrate 1, as shown in FIG. 7.

Next, the first insulating film 11 that becomes the gate insulating film 11 is deposited so as to cover the gate wire 43 and the common wire 43a (FIG. 8), and on the first insulating film, the semiconductor film 2 and the ohmic contact film 3 are deposited in this order. These are deposited on the entire surface of the substrate 1 by plasma CVD (Chemical Vapor Deposition), normal pressure CVD, reduced pressure CVD or the like.

For the gate insulating film 11, silicon nitride, silicon oxide or the like can be used. For the purpose of preventing a short circuit owing to an occurrence of a film loss such as a pin hole, preferably, the gate insulating film 11 is deposited a plurality of times. As the semiconductor film 2, amorphous silicon, polycrystalline silicon or the like can be used. Moreover, for the ohmic contact film 3, n-type amorphous silicon, n-type polycrystalline silicon or the like in which impurities such as phosphorous (P) are added at a high concentration can be used.

Moreover, on the ohmic contact film 3, a second metal film made of Cr, Ag, Ta, Ti, Mo, W, Ni, Cu, Au, Ag, the alloy film containing these as main components, or the stacked film of these is deposited, for example, by the sputtering method, the evaporation method or the like.

Figure 9:
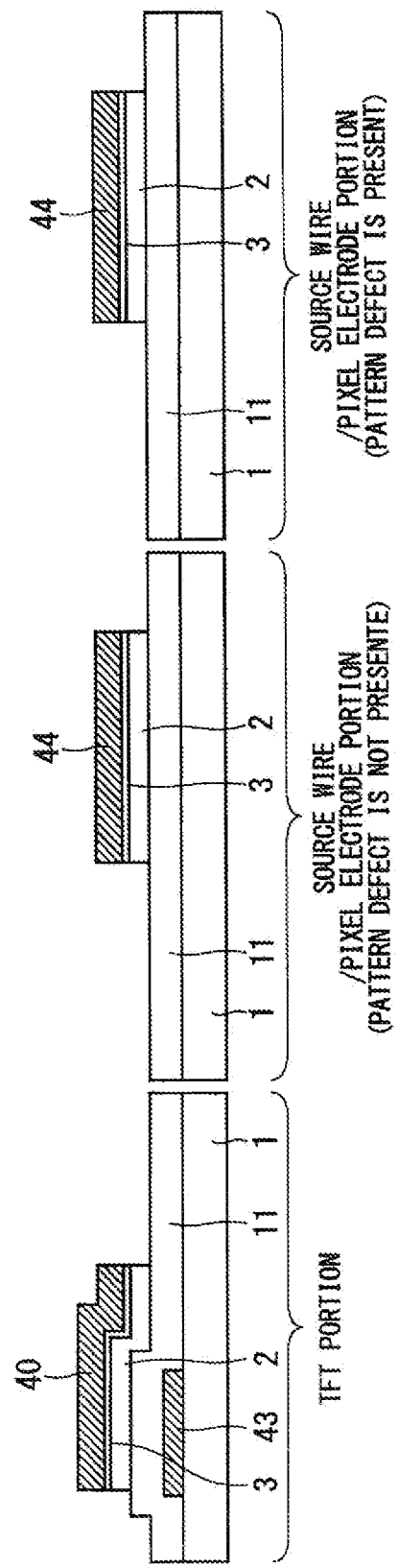

Next, a resist pattern is formed by the second photolithography step, and the second metal film, the ohmic contact film 3 and the semiconductor film 2 are sequentially etched by a second etching step using the resist pattern as a mask (FIG. 9).

In the second etching step, the second metal film is patterned into a shape made of the source wires 44 and metal films 40 which are branched from the source wires 44 and are extended in the forming regions of the TFTs 50. Each of the metal films 40 branched from the source wire 44 is separated into two in a subsequent step, and becomes the source electrode 4 and the drain electrode 5. That is to say, at this point of time, the second metal film 40 (metal film 40) remains on the portion that becomes the channel region of the TFT 50, and the source electrode 4 and the drain electrode 5 are in a state of connecting to each other. That is to say, in the second etching step, there are formed: the source electrode 4 and the drain electrode 5, which are in the state of connecting to each other; and the source wire 44 connected to the source electrode 4.

At this time, the source wire 44 is formed in a range, which does not overlap (is not brought into electrical contact with) the pixel electrode 6 formed in a subsequent step, and at substantially the same width as an interval between two pixel electrodes 6 adjacent to each other. In other words, the source wire 44 is formed as large as possible in the range that does not overlap the pixel electrode 6. In this preferred embodiment, if an area of the source wire 44, which is metal with a high reflectively, is increased in advance in this step, then the brightness difference between the normal pattern spot and the pattern defect spot 100 is increased in a subsequent pattern defect inspection, and the detection rate of the pattern defect can be enhanced.

Moreover, the ohmic contact film 3 and the semiconductor film 2 are also etched by using a mask with the same pattern as that of the second metal film (substantially, the patterned second metal film serves as a mask). In this way, the ohmic contact film 3 and the semiconductor film 2 are patterned into the same shape as that of the second metal film.

As described above, the patterning for the second metal film and the patterning for the ohmic contact film 3 and the semiconductor film 2 can be integrated into one etching step (second etching step) since the same mask is used. Thereafter, a second resist removal step of removing such a resist pattern formed in the second photolithography step is performed.

Figure 10:
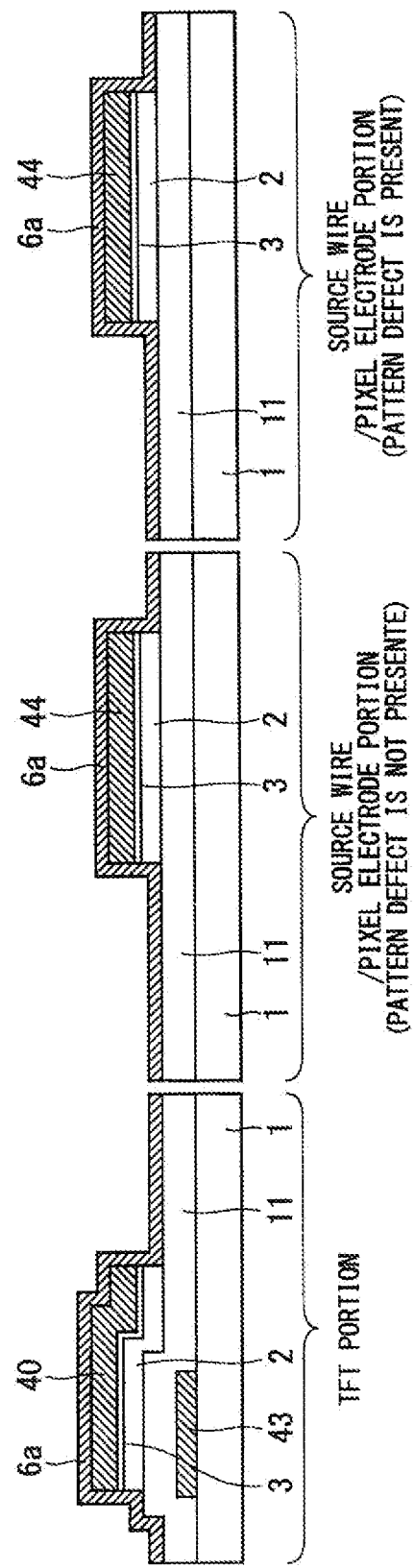

Next, the first transparent conductive film 6a that becomes the pixel electrode 6 is deposited on the entire surface of the substrate 1 by the sputtering method or the like (FIG. 10). As the first transparent conductive film 6a, ITO or the like can be used.

Then, by the third photolithography step, a resist pattern 103, which has apertures in a region from which the first transparent conductive film 6a is removed, is formed (FIG.

11). The apertures of the resist pattern 103 are provided at least on the channel region of the TFT 50 and on a region between the source wire 44 and the pixel electrode 6. In this preferred embodiment, the aperture provided on the region between the source wire 44 and the pixel electrode 6 is formed so that a part thereof can overlap an edge portion of the source wire 44 by a width of 1 μm or more.

Figure 11:
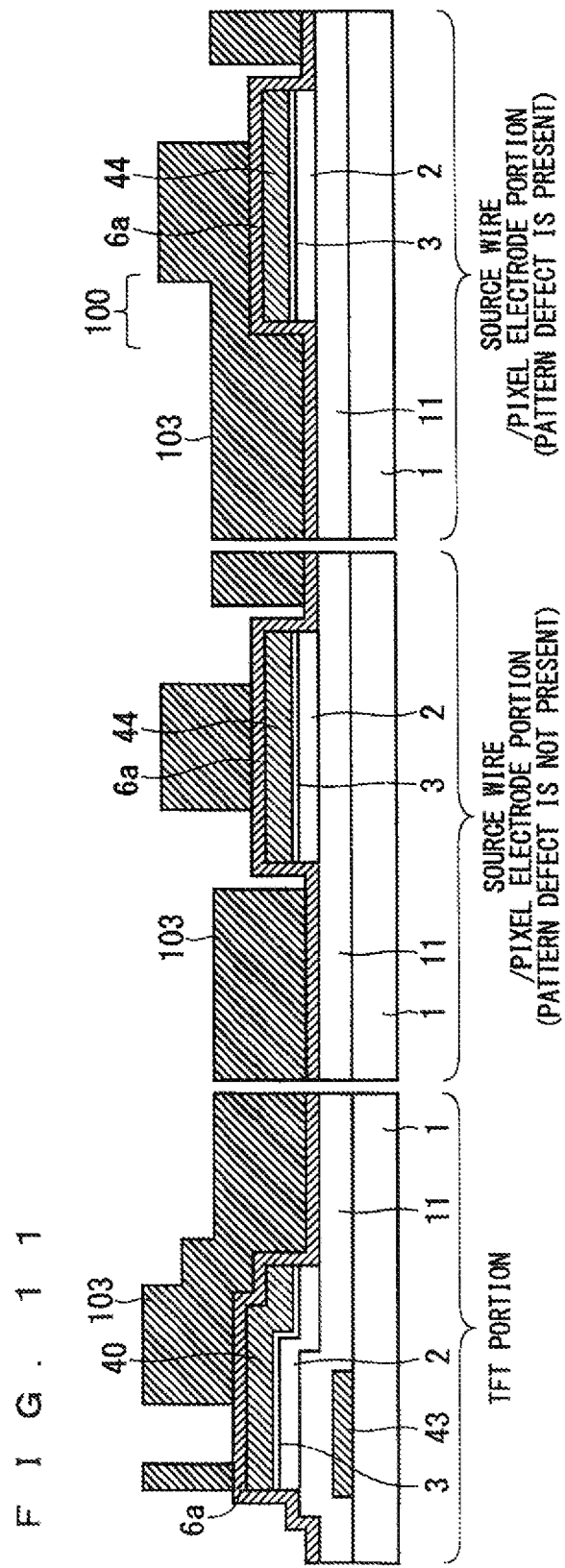

Moreover, as shown in FIG. 11, it is assumed that, in the pattern defect spot 100, the aperture is not formed in the resist pattern 103 owing to an influence of a foreign object and the like, and the resist pattern 103 remains as a pattern defect so as to lie astride the forming regions of the source wire 44 and the pixel electrode 6.

At this stage, if a pattern defect inspection for the resist pattern 103 is performed, and such a portion of the resist pattern 103 (or the foreign object), which lies astride the forming regions of the source wire 44 and the pixel electrode 6, is cut or removed (laser repair cut), then the occurrence of the cross talk point defect can be prevented; however, these steps will be described later. Here, a state is shown, where the process proceeds to a next step while leaving the pattern defect of the resist pattern 103.

Figure 12:
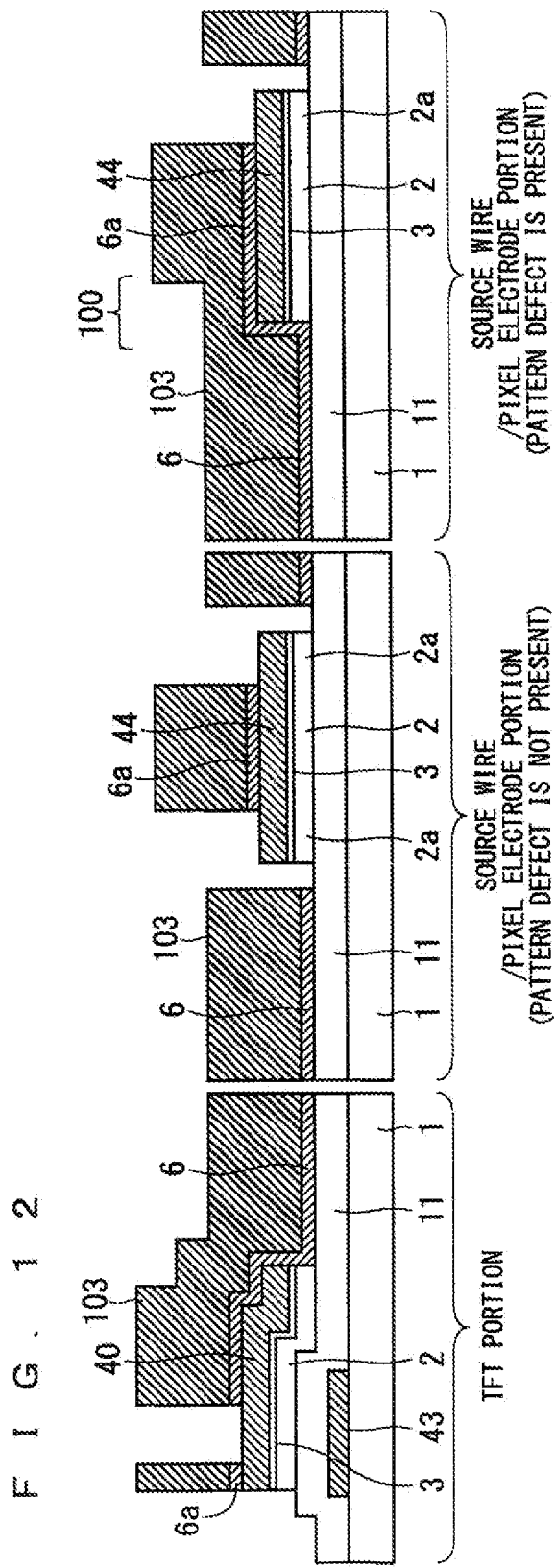

After the resist pattern 103 is formed, the first transparent conductive film 6a is removed by a third etching step using the resist pattern 103 as a mask (FIG. 12). In this way, the pixel electrode 6 is formed.

Figure 13:
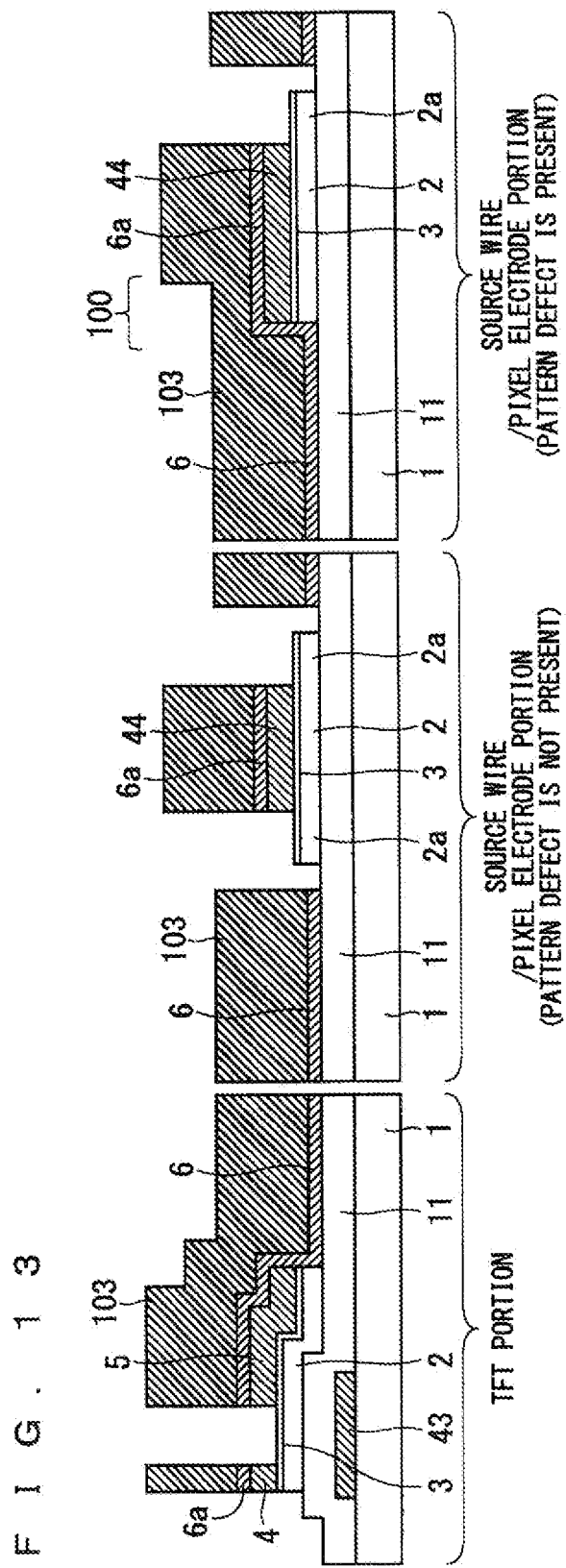

Subsequently, the second metal film (metal film 40 and source wire 44), which is exposed into the aperture of the resist pattern 103 by the fact that the first transparent conductive film 6a is removed, is removed (FIG. 13). In this way, the metal film 40 is separated into the source electrode 4 and the drain electrode 5. Moreover, the edge portion of the source wire 44 is removed.

Figure 14:
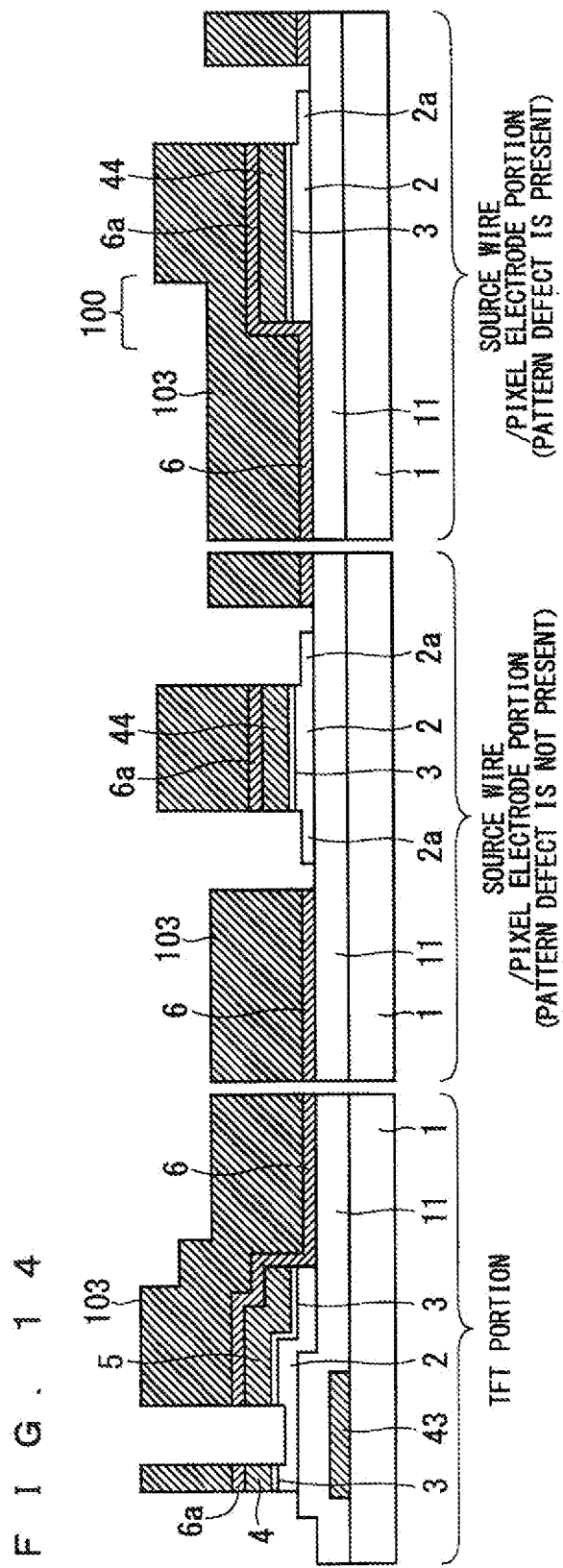

Moreover, the ohmic contact film 3, which is exposed into the aperture of the resist pattern 103 by the fact that the second metal film is removed, is removed (FIG. 14). In this way, a portion of the semiconductor film 2, which becomes the channel region of the TFT 50, is exposed. Moreover, the semiconductor film 2 is exposed to both sides of the source wire 44, and the exposed portions become the projecting portions 2a.

Figure 15:
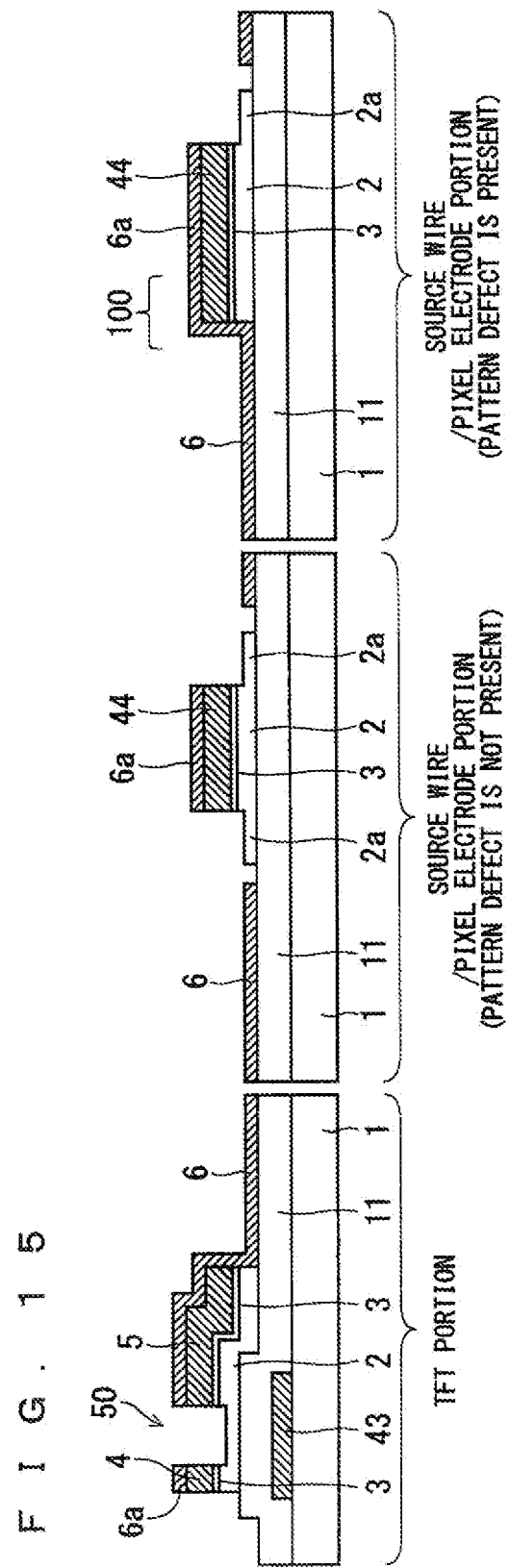

Thereafter, by a third resist removal step, the resist pattern 103 formed in the third photolithography step is removed (FIG. 15).

In the normal pattern spot, the source wire 44 and the projecting portions 2a on both sides of the source wire 44 are separated from the pixel electrode 6, and accordingly, the source wire 44 and the pixel electrode 6 are electrically separated from each other. However, in a portion of the pattern defect spot 100, the pattern defect of the first transparent conductive film 6a remains so as to connect the source wire 44 and the pixel electrode 6 to each other, and accordingly, the source wire 44 and the pixel electrode 6 are electrically connected to each other, thus causing the cross talk point defect.

If the pattern defect inspection for the first transparent conductive film 6a is performed at this stage, and the portion of the first transparent conductive film 6a, which connects the source wire 44 and the pixel electrode 6 to each other, is cut or removed (laser repair cut), then the cross talk point defect can be eliminated, and these steps will be described later. Here, a state is shown, where the process proceeds to a next step while leaving the pattern defect of the first transparent conductive film 6a.

Figure 16:
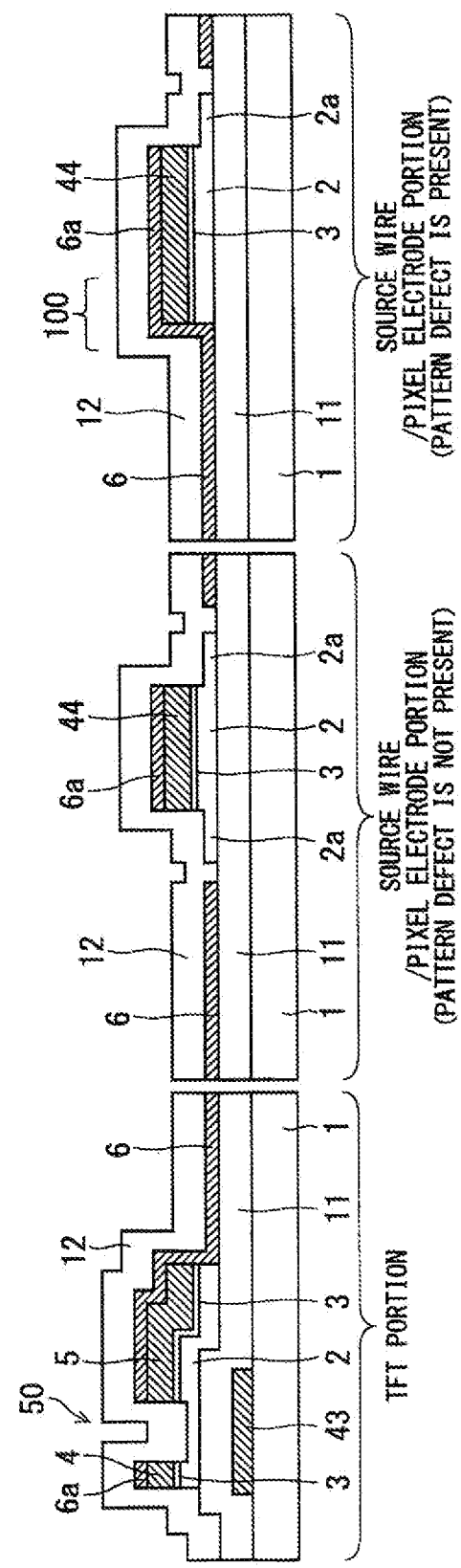

After the resist pattern 103 is removed, the second insulating film that becomes the interlayer insulating film 12 is deposited (FIG. 16). The interlayer insulating film 12 is formed of an inorganic insulating film of silicon nitride, silicon oxide or the like and is deposited on the entire surface of the substrate 1 by the CVD method or the like. In this way, the pixel electrode 6 and the first transparent conductive film 6a are covered with the interlayer insulating film 12. Moreover, the channel region of the semiconductor film 2 is covered with the interlayer insulating film 12.

Next, by the fourth photolithography step and a fourth etching step, the contact hole 13, which penetrates the interlayer insulating film 12 and the gate insulating film 11, is formed. As shown in FIG. 5, the contact hole 13 is formed so as to reach the common wire 43a.

Though not shown, in the frame region 42, terminals (gate terminals) for connecting the gate wires 43 to the scan signal drive circuit 45 and terminals (source terminals) for connecting the source wires 44 to the display signal drive circuit 46 are formed by using a wiring layer (first metal film) that is the same layer as the gate wires 43 or a wiring layer (second metal film) that is the same layer as the source wires 44. In the fourth photolithography step and the fourth etching step, contact holes which reach these terminals are also formed.

Thereafter, by a fourth resist removal step, the resist pattern formed in the fourth photolithography step is removed.

Figure 17:
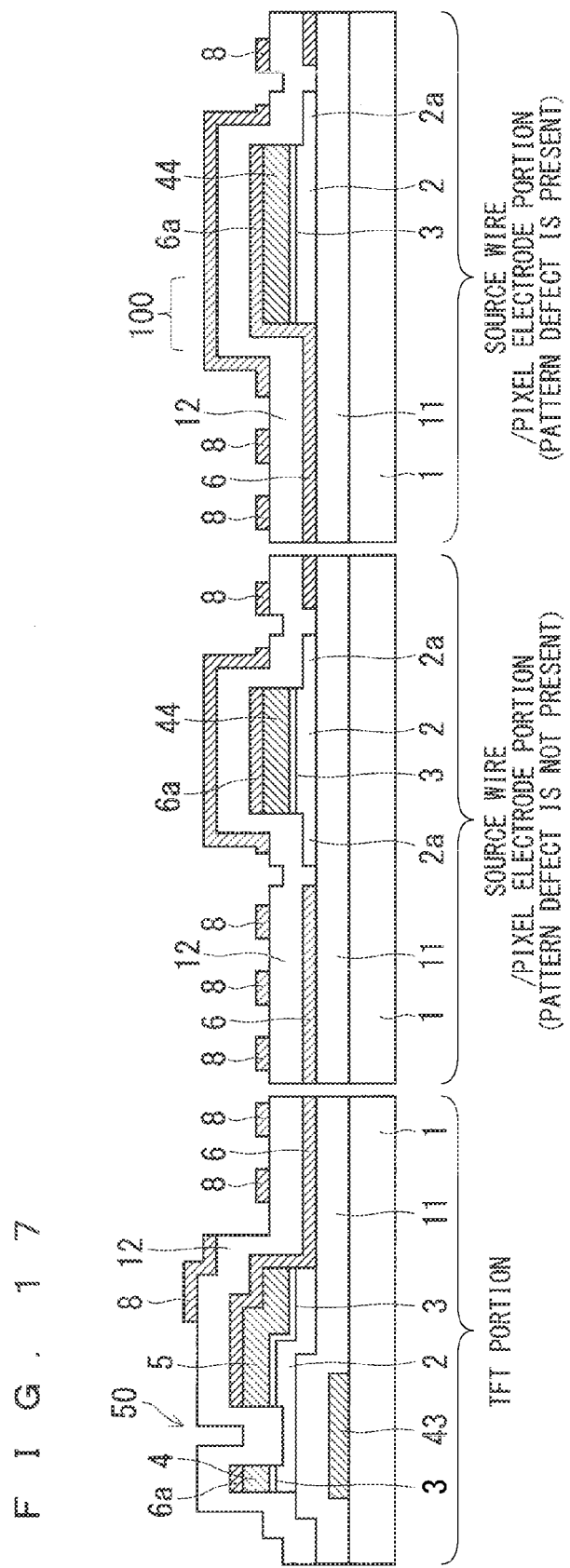

Next, on the interlayer insulating film 12, the second transparent conductive film that becomes the counter electrode 8 is deposited on the entire surface of the substrate 1 by the sputtering method or the like. ITO or the like can be used for the second transparent conductive film. Then, by the fifth photolithography step and a fifth etching step, the second transparent conductive film is patterned, and the counter electrode 8 having the slits is formed (FIG. 17). As shown in FIG. 5, the counter electrode 8 is also formed inside the contact hole 13 so as to connect to the common wire 43a.

At this time, in the frame region 42, there are formed: a pad (gate terminal pad) connected to the gate terminals through the contact holes; and a pad (source terminal pad) connected to the source terminals through the contact holes.

Thereafter, by a fifth resist removal step, the resist pattern formed in the fifth photolithography step is removed.

Throughout the above steps, the TFT array substrate is completed. As described above, the TFT array substrate of this preferred embodiment is formed by using at least five photolithography steps.

On the TFT array substrate fabricated as described above, an orientation film is formed in a subsequent cell step. Moreover, in a similar way, an orientation film is also formed on the counter substrate fabricated separately. Then, contact surfaces of the respective orientation films with the liquid crystal are subjected to orientation treatment for giving micro-size scratches in a single direction by using a method such as rubbing. Thereafter, a sealant is applied onto substrate peripheral edge portions, and the TFT array substrate and the counter substrate are pasted to each other at a predetermined interval so that the orientation films can face to each other. After the TFT array substrate and the counter substrate are pasted to each other, the liquid crystal is injected into between the TFT array substrate and the counter substrate, and the inlet is sealed. In this way, a liquid crystal cell is completed.

Then, the polarization plates are pasted onto both surfaces of the liquid crystal cells, the drive circuit is connected thereto, and thereafter, the backlight unit is attached thereto, whereby the liquid crystal display device is completed.

A description is made below of the pattern defect inspection for the TFT array substrate according to this preferred embodiment and of effects obtained in that event.

The pattern defect inspection and the cut and removal (laser repair cut) of the pattern defect, which are for preventing the occurrence of the cross talk point defect, are basically possible from the formation of the resist pattern 103 (after the third photolithography step) until before the formation of the interlayer insulating film 12. In this preferred embodiment, there is implemented either one of: a method of performing the pattern defect inspection and the laser repair cut for the resist pattern 103 at the stage where the resist pattern 103 is formed; and a method of performing the pattern defect inspection and the laser repair cut for the first transparent conductive film 6a at the stage where the resist pattern 103 is removed. That is to say, for the pattern defect inspection, there are: a case where the pattern defect inspection is performed in the state of FIG. 11, the pattern defect inspection being performed immediately after the formation of the resist pattern 103 (before the patterning of the first transparent conductive film 6a); and a case where the pattern defect inspection is performed in the state of FIG. 15, the pattern defect inspection being performed immediately after the removal of the resist pattern 103 (before the formation of the interlayer insulating film 12).

First, a description is made of the case where the pattern defect inspection is performed immediately after the formation of the resist pattern 103. Here, as a specific method of the pattern defect inspection, a method is adopted, in which pieces of brightness of reflected light at the same spots in three pixel patterns are measured by using a pattern defect inspection device or an optical inspection device, those are compared with one another, and a spot with brightness different from those of other two is detected as the pattern defect.

Figure 18:
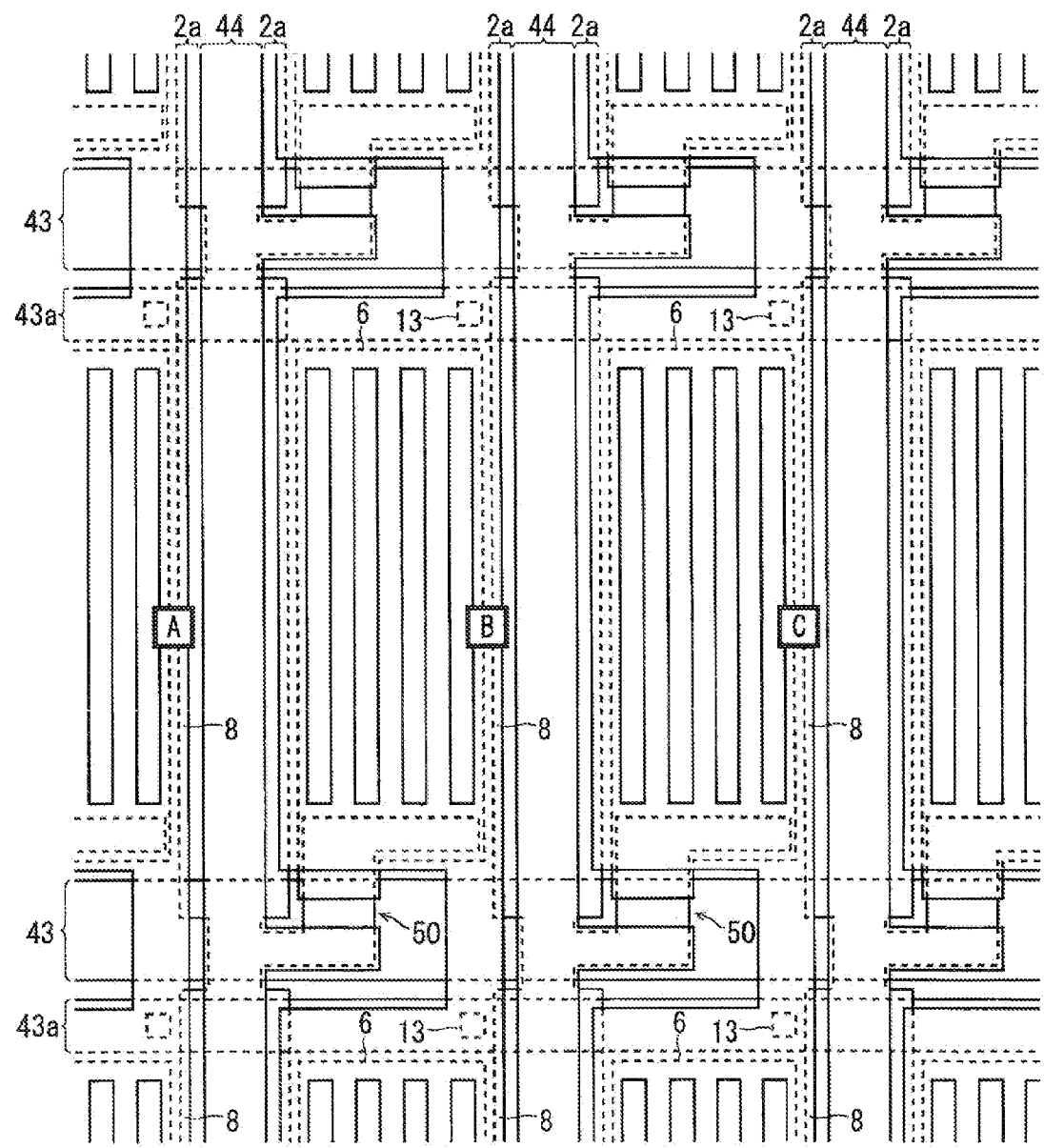
FIGS. 18 to 20 are views for explaining a pattern defect inspection for the TFT array substrate according to the preferred embodiment of the present invention.
Figure 19:
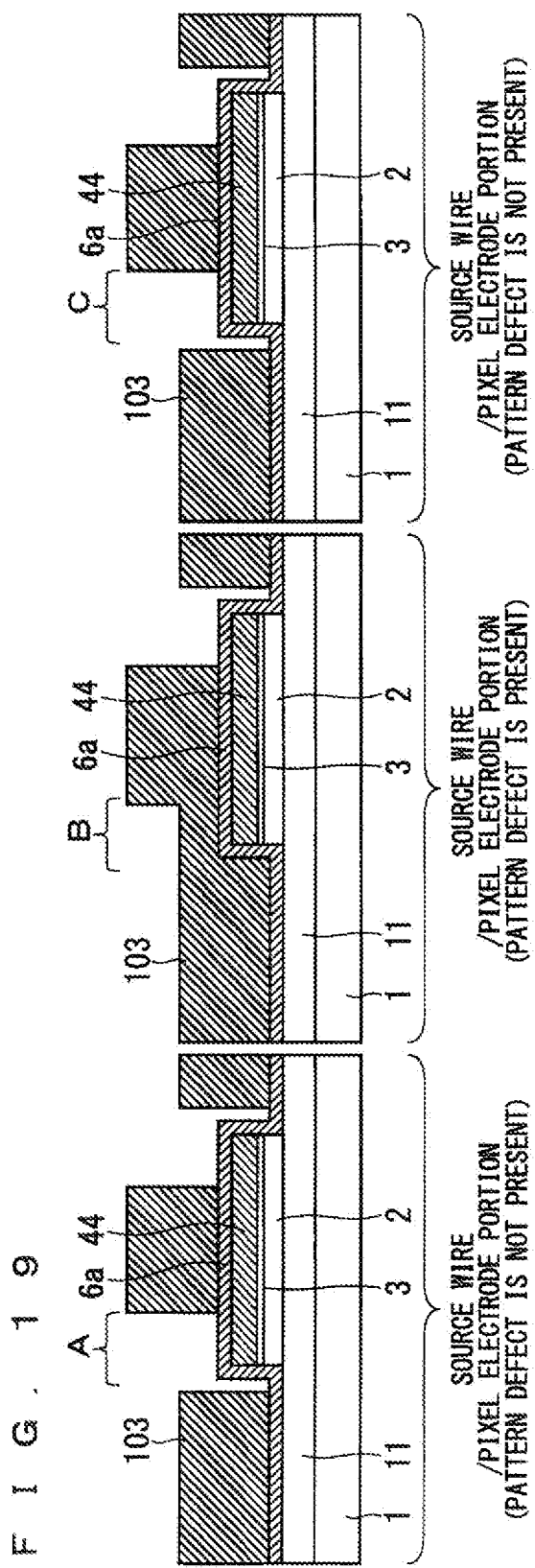

For example, there is considered a case of comparing pieces of brightness of reflected light at three spots corresponding to spots A to C shown in FIG. 18 (for convenience of illustration, the pixel electrodes 6 and the counter electrodes 8 are drawn in FIG. 18; however, the pattern defect inspection is implemented before those are formed). FIG. 19 is a cross-sectional view of source wire/pixel electrode portions individually including the spots A to C at a time of the pattern defect inspection. It is assumed that the spots A and C are normal pattern spots at which the apertures of the resist pattern 103 are normally formed, and that the spot B is a pattern defect spot at which the aperture is not formed in the resist pattern 103 owing to the influence of the foreign object or the like.

At the normal pattern spots A and C, the source wires 44 which are the metal film with a high reflectivity are exposed in a state of being covered with the first transparent conductive films 6a, and accordingly, the pieces of brightness of the reflected light are increased. Meanwhile, at the pattern defect spot B, the source wire 44 is in a state of being covered with the resist pattern 103 with a low reflectivity, and accordingly, the brightness of the reflected light is lowered. Therefore, the brightness of the pattern defect spot B becomes extremely smaller than the pieces of brightness of the normal pattern spots A and C.

When the pieces of brightness of the reflected light are measured according to 256 gradations, for example, the brightness of the spot A becomes 200, the brightness of the spot B becomes 35, and the brightness of the spot C becomes 202. In this case, brightness differences between the normal pattern spots A and C and the pattern defect spot B are as large as 165 to 167, and accordingly, it becomes easy to detect the pattern defect by the pattern defect inspection device or the optical inspection device.

The brightness of the reflected light is varied by intensity of irradiation light, the material of the source wires 44, the material and film thickness of the resist pattern 103, and the like. The intensity of the irradiation light, the material of the source wires 44, the material and film thickness of the resist pattern 103, and the like are recommended to be determined so that the brightness difference (gradation difference) between the resist pattern 103 and each of the source wires 44 can stay within a range of 100 to 200.

As described above, in accordance with this preferred embodiment, in the pattern defect inspection performed immediately after the formation of the resist pattern 103, the brightness difference between the normal pattern spot and the pattern defect spot is increased, and the detection of the pattern defect can be performed easily, and accordingly, the detection rate of the pattern defect can be enhanced. Moreover, the detected pattern defect (resist material or foreign object) of the resist pattern 103 is subjected to the laser repair cut, whereby the occurrence of the cross talk point defect can be prevented, and yield is enhanced.

Figure 20:
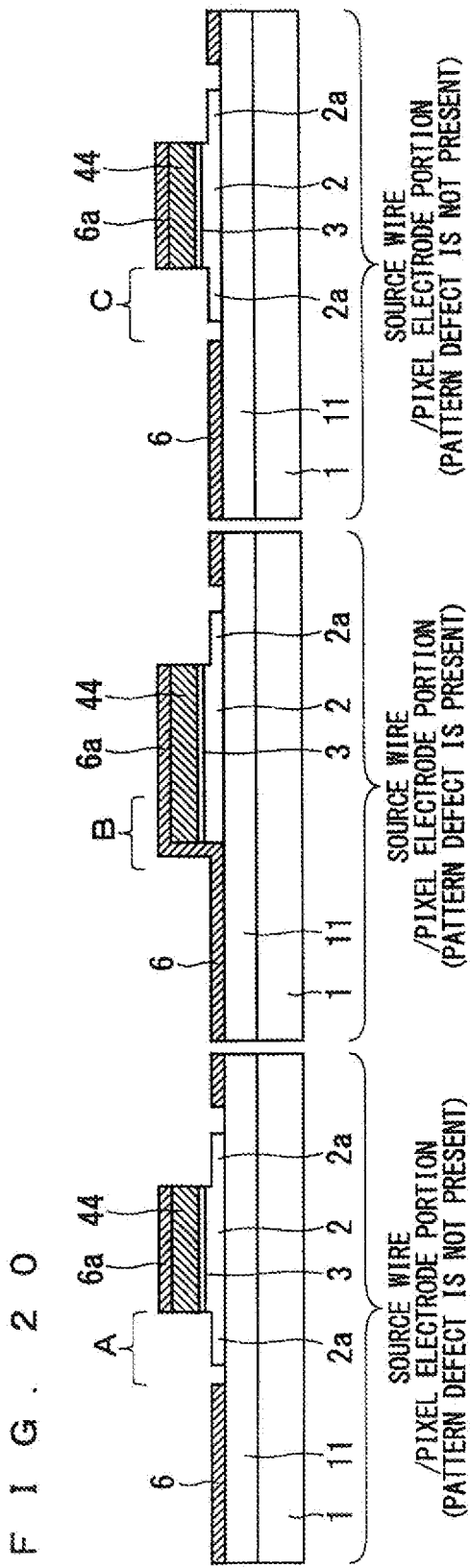

Next, a description is made of the case where the pattern defect inspection is performed immediately after the removal of the resist pattern 103. Also here, the case of comparing the pieces of brightness of the reflected light at three spots corresponding to the spots A to C shown in FIG. 18 is considered. FIG. 20 is a cross-sectional view of source wire/pixel electrode portions individually including the spots A to C at the time of the pattern defect inspection. It is assumed that the spots A and C are normal pattern spots from which the first transparent conductive films 6a are removed normally, and that the spot B is a pattern defect spot in which the first transparent conductive film 6a remains since the aperture is not formed in the resist pattern 103 owing to the influence of the foreign object or the like.

To the normal pattern spots A and C, the semiconductor films 2 (projecting portions 2a) with a low reflectively are exposed, and accordingly, the pieces of brightness of the reflected light are lowered. Meanwhile, to the pattern defect spot B, the source wire 44 that is the metal film with a high reflectivity is exposed in the state of being covered with the first transparent conductive film 6a, and accordingly, the brightness of the reflected light is increased. Therefore, the brightness of the pattern defect spot B becomes extremely larger than the pieces of brightness of the normal pattern spots A and C.

When the pieces of brightness of the reflected light are measured according to 256 gradations, for example, the brightness of the spot A becomes 20, the brightness of the spot B becomes 200, and the brightness of the spot C becomes 22. In this case, the brightness differences between the normal pattern spots A and C and the pattern defect spot B are as large as 178 to 180, and accordingly, it becomes easy to detect the pattern defect.

The brightness of the reflected light is varied by the intensity of the irradiation light and the materials of the source wires 44 and the semiconductor films 2. The intensity of the irradiation light and the materials of the source wires 44 and the semiconductor films 2 are recommended to be determined so that the brightness difference (gradation difference) between each of the semiconductor films 2 and each of the source wires 44 can stay within a range of 100 to 220.

As described above, in accordance with this preferred embodiment, also in the pattern defect inspection performed immediately after the removal of the resist pattern 103, the brightness difference between the normal pattern spot and the pattern defect spot is increased, and the detection of the pattern defect can be performed easily, and accordingly, the detection rate of the pattern defect can be enhanced. Moreover, the detected pattern defect of the first transparent conductive film 6a is subjected to the laser repair cut, whereby the occurrence of the cross talk point defect can be prevented, and the yield is enhanced.

Figure 21:
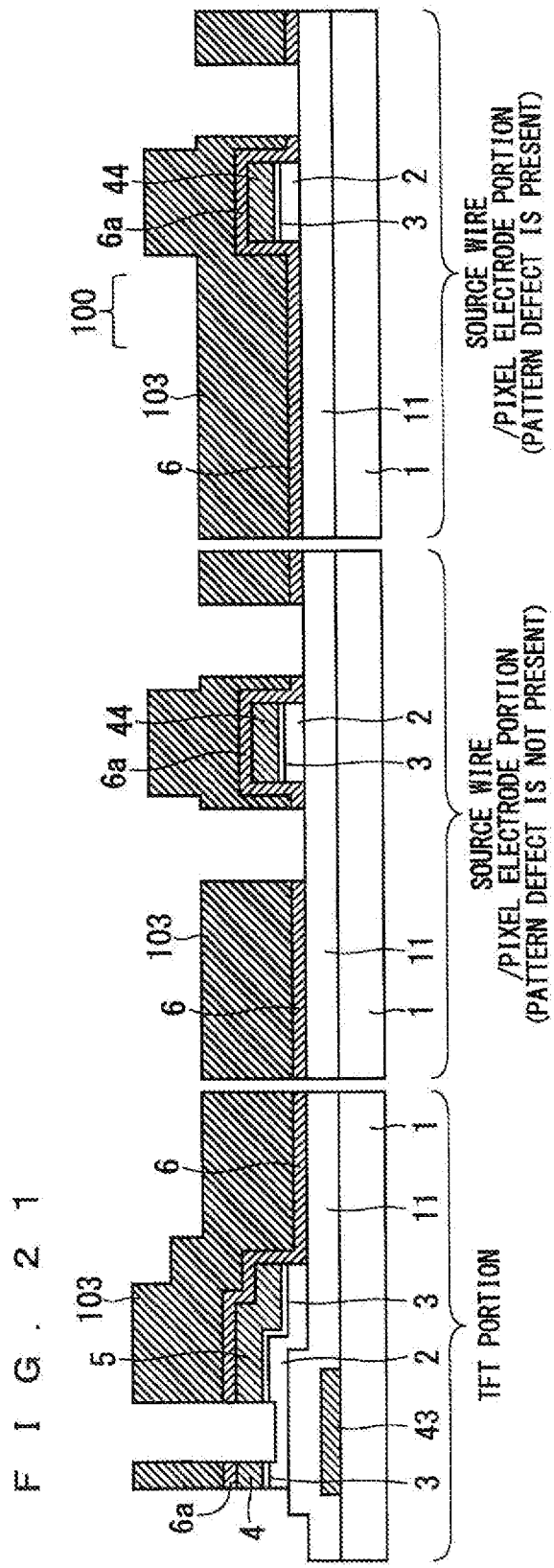
FIG. 21 is a manufacturing step view of a conventional TFT array substrate.
Figure 22:
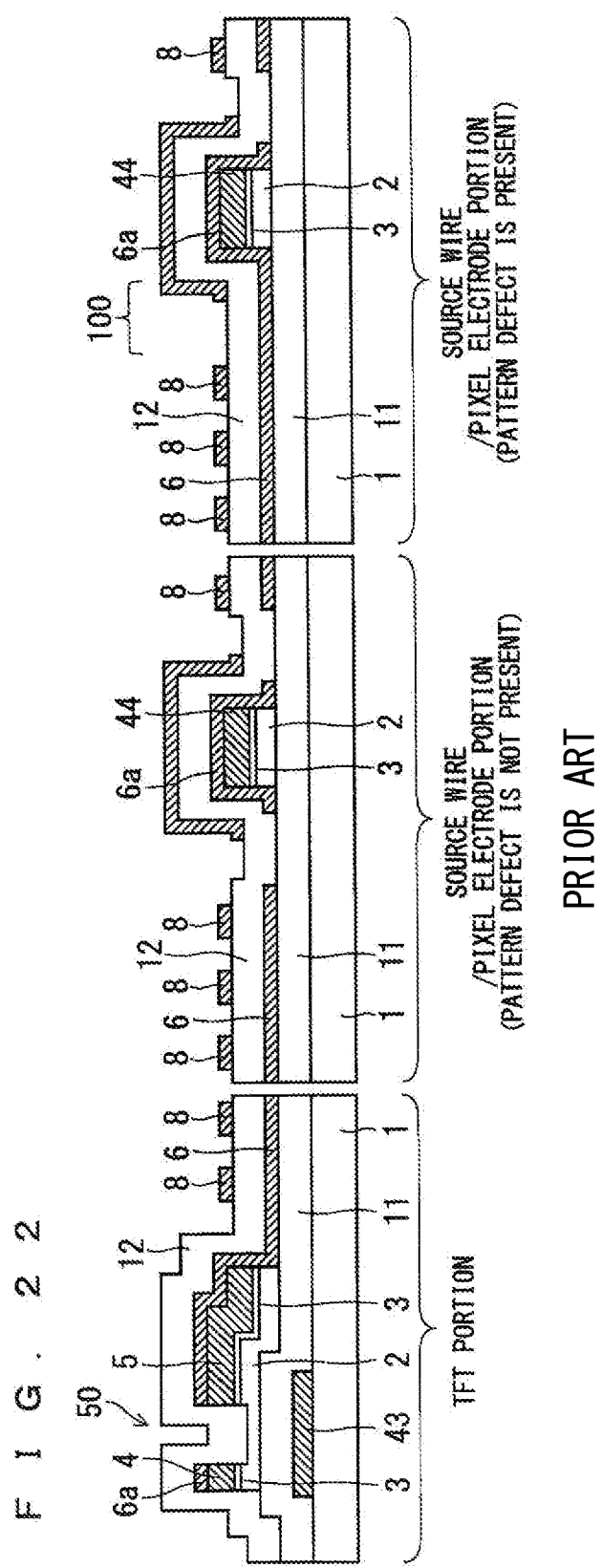
FIG. 22 is a cross-sectional view showing a configuration of a conventional TFT array substrate.
Figure 23:
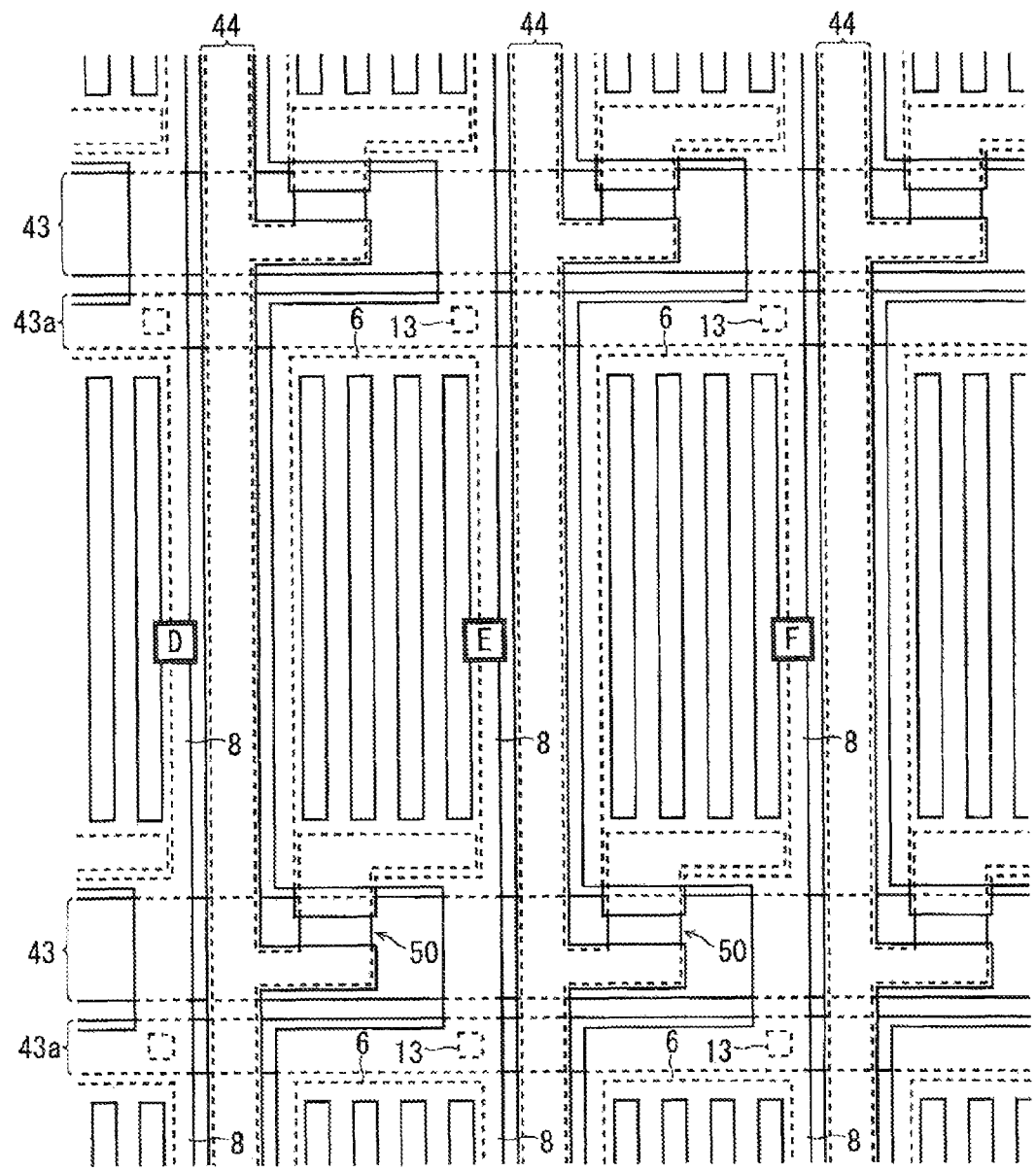

Here, as a comparative example for further clarifying the effects of the present invention, the TFT array substrate in Japanese Patent Application Laid-Open No. 2010-191410 is shown. In the manufacturing method of the TFT array substrate in Japanese Patent Application Laid-Open No. 2010-191410, the aperture of the resist pattern 103, which is formed in the third photolithography step, and is used for the patterning of the first transparent conductive film 6a, is arranged so as not to overlap the source wires 44 as shown in FIG. 21. Moreover, a final structure of the TFT array substrate in Japanese Patent Application Laid-Open No. 2010-191410 becomes as shown in FIG. 22. In FIG. 21 and FIG. 22, as a cross section of the source wire/pixel electrode portion, two are shown, which are: a portion where the normal pattern is formed; and a portion of the resist pattern 103, which includes the pattern defect spot 100.

In the TFT array substrate in Japanese Patent Application Laid-Open No. 2010-191410, the aperture of the resist pattern 103 is arranged so as not to overlap the source wires 44, and accordingly, the projecting portions 2a are not formed in the semiconductor film 2 under each of the source wires 44. That is to say, a width of the source wire 44 of the TFT array substrate in Japanese Patent Application Laid-Open No. 2010-191410 is determined in the second photolithography step and the second etching step. Therefore, the width of the source wire 44 is not affected by whether or not the pattern defect of the resist pattern 103 is present.

A description is made of a case where the pattern defect inspection for the TFT array substrate in Japanese Patent Application Laid-Open No. 2010-191410 is performed immediately after the formation of the resist pattern 103. For example, there is considered a case of comparing pieces of brightness of reflected light at three spots corresponding to spots D to F shown in FIG. 23 (for convenience of illustration, the pixel electrodes 6 and the counter electrodes 8 are drawn in FIG. 23; however, the pattern defect inspection is implemented before those are formed). FIG. 24 is a cross-sectional view of source wire/pixel electrode portions individually including the spots D to F at the time of the pattern defect inspection. It is assumed that the spots D and F are normal pattern spots at which the apertures of the resist pattern 103 are normally formed, and that the spot E is a pattern defect spot at which the aperture is not formed in the resist pattern 103 owing to the influence of the foreign object or the like.

At the normal pattern spots D and F, the gate insulating film 11 covered with the first transparent conductive film 6a is exposed, and the pattern defect spot E is in a state of being covered with the resist pattern 103. In comparison with the resist pattern 103, each of the first transparent conductive film 6a and the gate insulating film 11 has a higher reflectivity, and accordingly, brightness of the pattern defect spot E is lowered more than the brightness of each of the normal pattern spots D and F. However, the first transparent conductive film 6a and the gate insulating film 11 are transparent, and the reflectivity thereof is not very high. Therefore, brightness differences between the normal pattern spots D and F and the pattern defect spot E become relatively small.

When the pieces of brightness of the reflected light are measured according to 256 gradations, for example, the brightness of the spot D becomes 50, the brightness of the spot E becomes 35, and the brightness of the spot F becomes 52. In this case, brightness differences between the normal pattern spots D and E and the pattern defect spot E become 15 to 17, and become remarkably smaller in comparison with the case of the present invention. Note that, if the intensity of the irradiation light is increased, then the pieces of brightness of the reflected light at the respective spots can be increased; however, the differences therebetween do not become very large.

Next, a description is made of a case where the pattern defect inspection for the TFT array substrate in Japanese Patent Application Laid-Open No. 2010-191410 is performed immediately after the removal of the resist pattern 103. Also here, there is considered the case of comparing the pieces of brightness of the reflected light at three spots corresponding to the spots D to F shown in FIG. 23. FIG. 25 is a cross-sectional view of the source wire/pixel electrode portions individually including the spots D to F at the time of the pattern defect inspection. It is assumed that the spots D and F are normal pattern spots from which the first transparent conductive films 6a are removed normally, and that the spot E is a pattern defect spot in which the first transparent conductive film 6a remains since the aperture is not formed in the resist pattern 103 owing to the influence of the foreign object or the like.

At the normal pattern spots D and F, the gate insulating film 11 is exposed, and at the pattern defect spot E, the first transparent conductive film 6a that covers the gate insulating film 11 is exposed. In comparison with the gate insulating film 11, the first transparent conductive film 6a has a higher reflectivity, and accordingly, the brightness of the pattern defect spot E is increased more than the brightness of each of the normal pattern spots D and F. However, the first transparent conductive film 6a and the gate insulating film 11 are transparent, and the reflectivity thereof is not very high. Therefore, the brightness differences between the normal pattern spots D and F and the pattern defect spot E become relatively small.

When the pieces of brightness of the reflected light are measured according to 256 gradations, for example, the brightness of the spot D becomes 50, the brightness of the spot E becomes 60, and the brightness of the spot F becomes 52. In this case, the brightness differences between the normal pattern spots D and E and the pattern defect spot F become 10 to 12, and also in this case, become remarkably smaller in comparison with the case of the present invention.

Note that the above-mentioned numeric values of the pieces of brightness and brightness differences of the reflected light are merely examples.

In the above-described preferred embodiment, the description is made so that, in the third etching step, the resist pattern formed in the third photolithography step can become the mask for the etching for all of the first transparent conductive film 6a, the second metal film, the ohmic contact film 3 and the semiconductor film 2. However, the etching for the second metal film, the ohmic contact film 3 and the semiconductor film 2 may be performed by using, as a mask, the patterned first transparent conductive film 6a (including the pixel electrode 6). However, the resist pattern 103 is removed earlier than in the above-described preferred embodiment. In this connection, in that case, the pattern defect inspection, which is implemented immediately after the removal of the resist pattern 103 in the above-described preferred embodiment, is recommended to be implemented immediately after the patterning of the ohmic contact film 3 (before the formation of the interlayer insulating film 12).

Moreover, there is shown the example of using ITO as the transparent electrode that composes the pixel electrode 6 and the counter electrode 8; however, for example, IZO (Indium Zinc Oxide) may be used. With regard to IZO, an amount of a micro-fine residue generated on the gate insulating film 11 in an event of etching for removing the same IZO is small, and accordingly, opacity caused by the micro-fine residue can be prevented, and display quality of the liquid crystal display device is enhanced. Moreover, the fact that the amount of micro-fine residue on the gate insulating film is small brings an advantage in enhancement of adherence between the gate insulating film 11 and the interlayer insulating film 12 since it becomes possible to efficiently remove the micro-fine residue in an event of performing dry etching for the surface of the gate insulating film 11. Because of the same reason, IGZO (Indium Gallium Zinc Oxygen) may be used for the transparent electrode.

Moreover, FIG. 2 shows the configuration, in which the counter electrodes 8 of the pixels 47 adjacent to each other with the gate wire 43 being sandwiched therebetween connect to each other; however, the shape of the counter electrodes 8 is not limited to this. The counter electrodes 8 of the respective pixels 47 are electrically connected to the common wires 43a through the contact holes 13, and accordingly, if the same signal (voltage) is applied individually to the common wires 43a, then the counter electrodes 8 of the pixels 47 adjacent to each other with the gate wire 43 being sandwiched therebetween may be spaced apart from each other.

Furthermore, FIG. 2 shows the example where the longitudinal direction of the slits of the counter electrodes 8 is parallel to the source wires 44; however, the direction of the slits of the counter electrodes 8 may be an arbitrary direction. Moreover, the longitudinal direction of the slit may differ for each of the counter electrodes 8. The shape of the counter electrodes 8 just needs to be one, for example, such as a comb-tooth shape, which can generate the fringe field with the pixel electrodes 6.

The application of the present invention is not limited to the TFT array substrate having the TFTs, and the present invention is widely applicable to TFT array substrates, each having a configuration in which the pixel electrodes are formed by directly overlapping the drain electrodes of the TFTs of the respective pixels.

While the invention has been shown and described in detail, the foregoing description is in all aspects illustrative and not restrictive. It is therefore understood that numerous modifications and variations can be devised without departing from the scope of the invention.

What is claimed is:

1. A thin film transistor array substrate having a thin film transistor, the thin film transistor array substrate comprising:
   a gate electrode of said thin film transistor and a gate wire connected to said gate electrode, said gate electrode and said gate wire being formed on a substrate;
   a gate insulating film that covers said gate electrode and said gate wire;
   a semiconductor film formed on said gate insulating film;
   a source electrode and a drain electrode of said thin film transistor formed on said semiconductor film above said gate electrode;
   a source wire connected to said source electrode, said source wire being formed on said gate insulating film;
   a pixel electrode formed by being partially and directly stacked on said drain electrode;
   an interlayer insulating film that covers said source electrode, said drain electrode, said source wire and said pixel electrode; and
   a counter electrode arranged opposite to said pixel electrode with said interlayer insulating film being interposed therebetween, wherein
   said semiconductor film is provided under said drain electrode, said source electrode and said source wire, and in a region between said source electrode and said drain electrode, and
   said semiconductor film only under said source wire has a portion projecting beyond said source wire on both sides, a width of the portion being 1 μm or more.

2. The thin film transistor array substrate according to claim 1, wherein
   said counter electrode partially covers said source wire, and connects to a counter electrode of a pixel adjacent to said counter electrode with said source wire being sandwiched therebetween.

3. The thin film transistor array substrate according to claim 1, wherein
   said counter electrode partially covers said gate electrode, and connects to a counter electrode of a pixel adjacent to said counter electrode with said gate wire being sandwiched therebetween.

4. The thin film transistor array substrate according to claim 1, further comprising:
   a common wire formed in the same layer as said gate wire, wherein
   said counter electrode is electrically connected to said common wire through a contact hole that penetrates said gate insulating film and said interlayer insulating film.

5. The thin film transistor array substrate according to claim 1, further comprising:
   an ohmic contact film formed individually between said source electrode and said semiconductor film, between said drain electrode and said semiconductor film, and between said source wire and said semiconductor film, wherein
   said source electrode and said drain electrode are electrically connected to said semiconductor film via said ohmic contact film.

6. The thin film transistor array substrate according to claim 1, wherein
   said source electrode, said drain electrode and said source wire are formed of Al or an alloy containing Al as a main component or Ag or an alloy containing Ag as a main component.

7. A liquid crystal display device comprising:
   the thin film transistor array substrate according to claim 1.

8. The thin film transistor array substrate according to claim 1, wherein
   a width of said semiconductor film under said source wire and a distance between the pixel electrodes are substantially the same, and
   said semiconductor film under said source wire and said pixel electrodes do not contact directly.

* * * * *